(12) United States Patent
Jeon et al.

(10) Patent No.: US 10,256,318 B2
(45) Date of Patent: Apr. 9, 2019

(54) METHOD OF MANUFACTURING SEMICONDUCTOR DEVICE TO PREVENT DEFECTS

(71) Applicant: Samsung Electronics Co., Ltd., Suwon-si, Gyeonggi-do (KR)

(72) Inventors: Yong-ho Jeon, Hwaseong-si (KR); Dae-hyun Jang, Hwaseong-si (KR); Seung-seok Ha, Hwaseong-si (KR); Young-ju Park, Hwaseong-si (KR); Sun-ki Min, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 2 days.

(21) Appl. No.: 15/404,659

(22) Filed: Jan. 12, 2017

(65) Prior Publication Data

US 2017/0309724 A1    Oct. 26, 2017

(30) Foreign Application Priority Data

Apr. 26, 2016    (KR) .......................... 10-2016-0051099

(51) Int. Cl.
*H01L 21/02* (2006.01)
*H01L 29/66* (2006.01)
(Continued)

(52) U.S. Cl.
CPC .... *H01L 29/66545* (2013.01); *H01L 21/0214* (2013.01); *H01L 21/0217* (2013.01);
(Continued)

(58) Field of Classification Search
CPC ......... H01L 29/66545; H01L 29/66871; H01L 29/66606
See application file for complete search history.

(56) References Cited

U.S. PATENT DOCUMENTS

| 7,410,885 B2 | 8/2008 | Schuehrer et al. |
| 8,562,750 B2 | 10/2013 | Chen et al. |

(Continued)

FOREIGN PATENT DOCUMENTS

| JP | 2003-203900 A | 7/2003 |
| KR | 2000-0038673 A | 7/2000 |

(Continued)

*Primary Examiner* — Jaehwan Oh
*Assistant Examiner* — John M Parker
(74) *Attorney, Agent, or Firm* — Harness, Dickey & Pierce, P.L.C.

(57) ABSTRACT

A method of manufacturing a semiconductor device includes forming dummy gate structures including a dummy gate insulating layer and dummy gate electrodes, on a first region of a semiconductor substrate, the first region including a patterning region, forming spacers on two side walls of each of the dummy gate structures, forming an interlayer insulating layer on the semiconductor substrate and the dummy gate structures, forming a protective insulating layer on a second region of the semiconductor substrate, the second region including a non-patterning region, forming a liner layer on the protective insulating layer, planarizing the interlayer insulating layer by using the liner layer as an etching mask to expose top surfaces of the dummy gate structures, forming openings by removing the dummy gate structures to expose the semiconductor substrate between the spacers, and forming gate structures including a gate insulating layer and metal gate electrodes, in the openings.

13 Claims, 25 Drawing Sheets

(51) Int. Cl.
*H01L 21/311* (2006.01)
*H01L 21/321* (2006.01)
*H01L 21/8234* (2006.01)

(52) U.S. Cl.
CPC .... *H01L 21/31144* (2013.01); *H01L 21/3212* (2013.01); *H01L 21/823431* (2013.01); *H01L 21/823437* (2013.01); *H01L 29/6656* (2013.01)

(56) References Cited

U.S. PATENT DOCUMENTS

| | | | |
|---|---|---|---|
| 8,685,827 B2 * | 4/2014 | Kim | H01L 21/82345 438/238 |
| 8,928,120 B1 | 1/2015 | Liu et al. | |
| 9,330,983 B1 * | 5/2016 | Cheng | H01L 21/823864 |
| 9,343,372 B1 * | 5/2016 | Bao | H01L 29/401 |
| 9,478,625 B1 * | 10/2016 | Zang | H01L 21/823431 |
| 2010/0001331 A1 * | 1/2010 | Mikasa | H01L 27/10855 257/306 |
| 2011/0256685 A1 | 10/2011 | Suzuki et al. | |
| 2013/0140567 A1 | 6/2013 | Kim et al. | |
| 2015/0364419 A1 * | 12/2015 | Tran | H01L 28/20 438/238 |
| 2015/0371956 A1 | 12/2015 | Agarwal et al. | |
| 2016/0005672 A1 | 1/2016 | Dubey et al. | |
| 2016/0172356 A1 * | 6/2016 | Cheng | H01L 27/0629 257/379 |

FOREIGN PATENT DOCUMENTS

| | | |
|---|---|---|
| KR | 2004-0017159 A | 2/2004 |
| KR | 10-0507872 B1 | 8/2005 |
| KR | 10-0850102 B1 | 8/2008 |
| KR | 2009-0044523 A | 5/2009 |

* cited by examiner

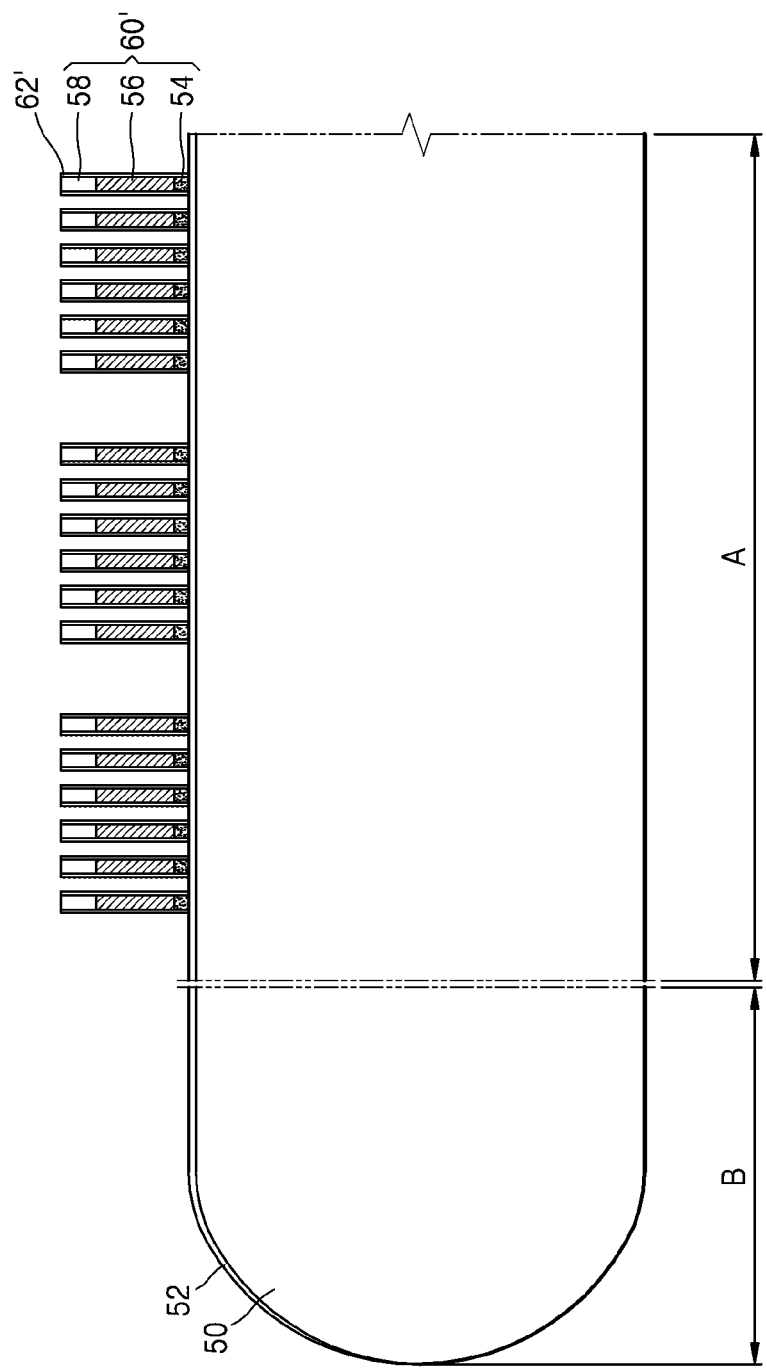

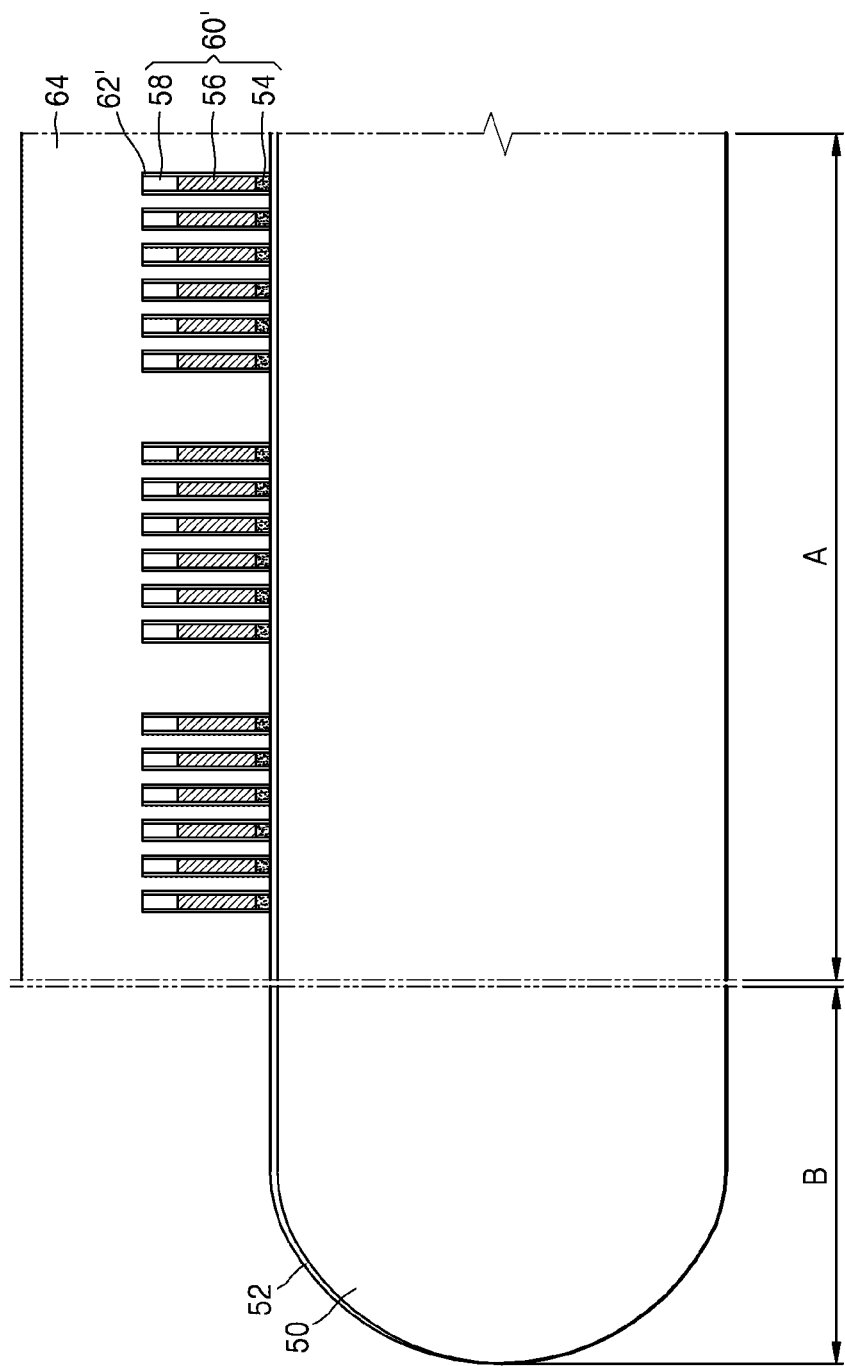

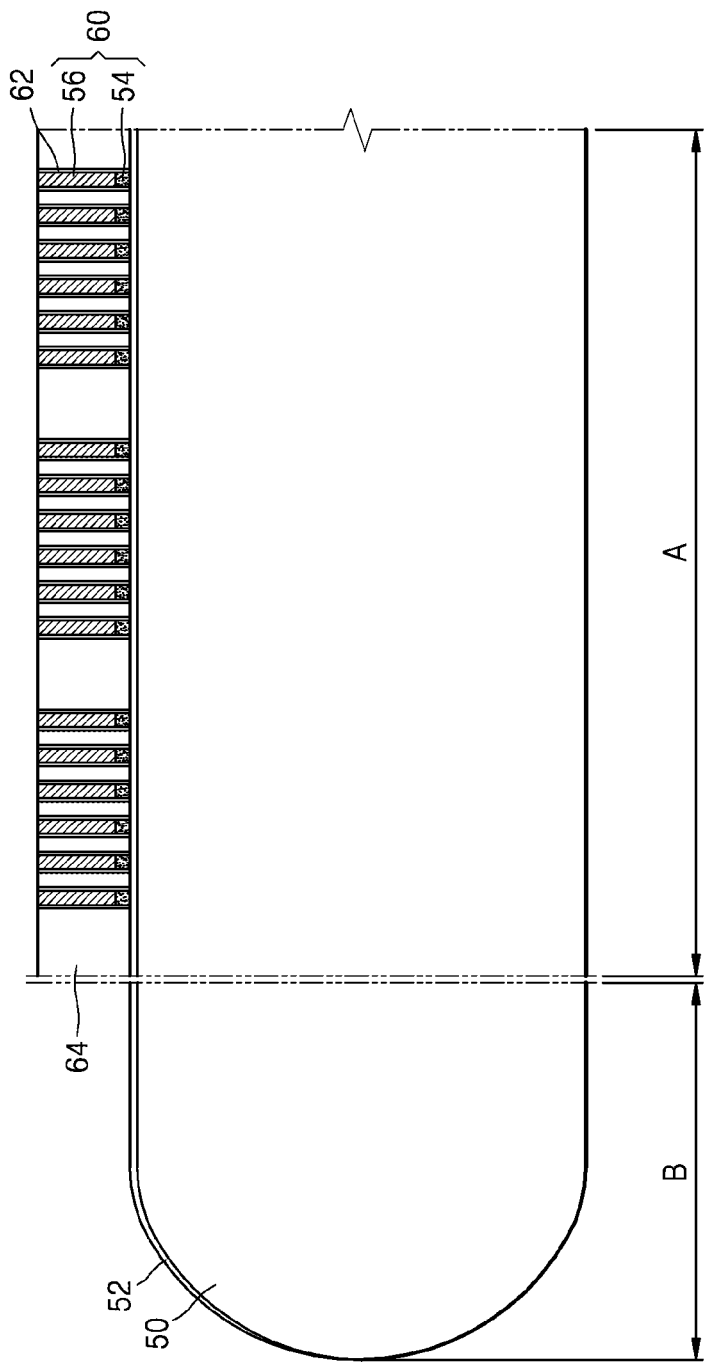

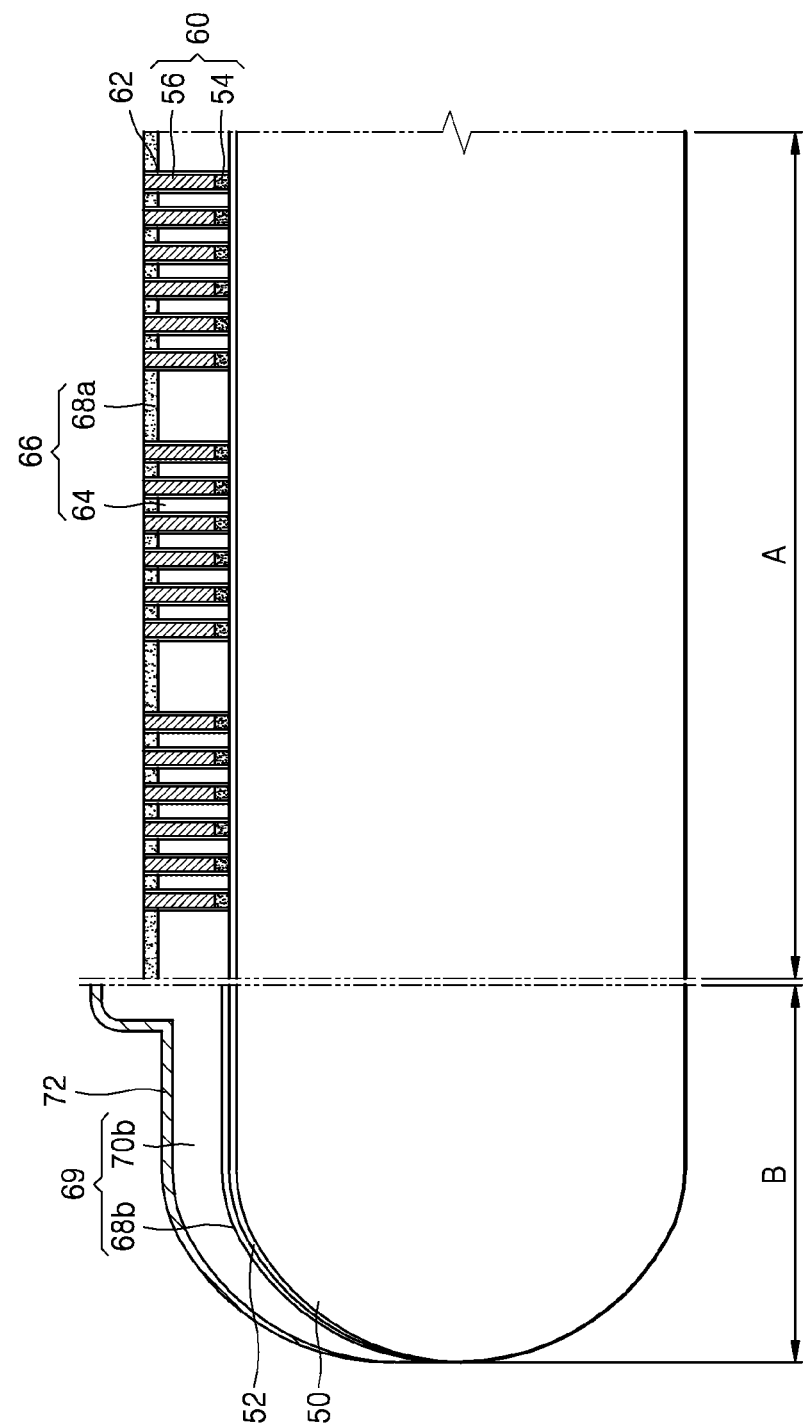

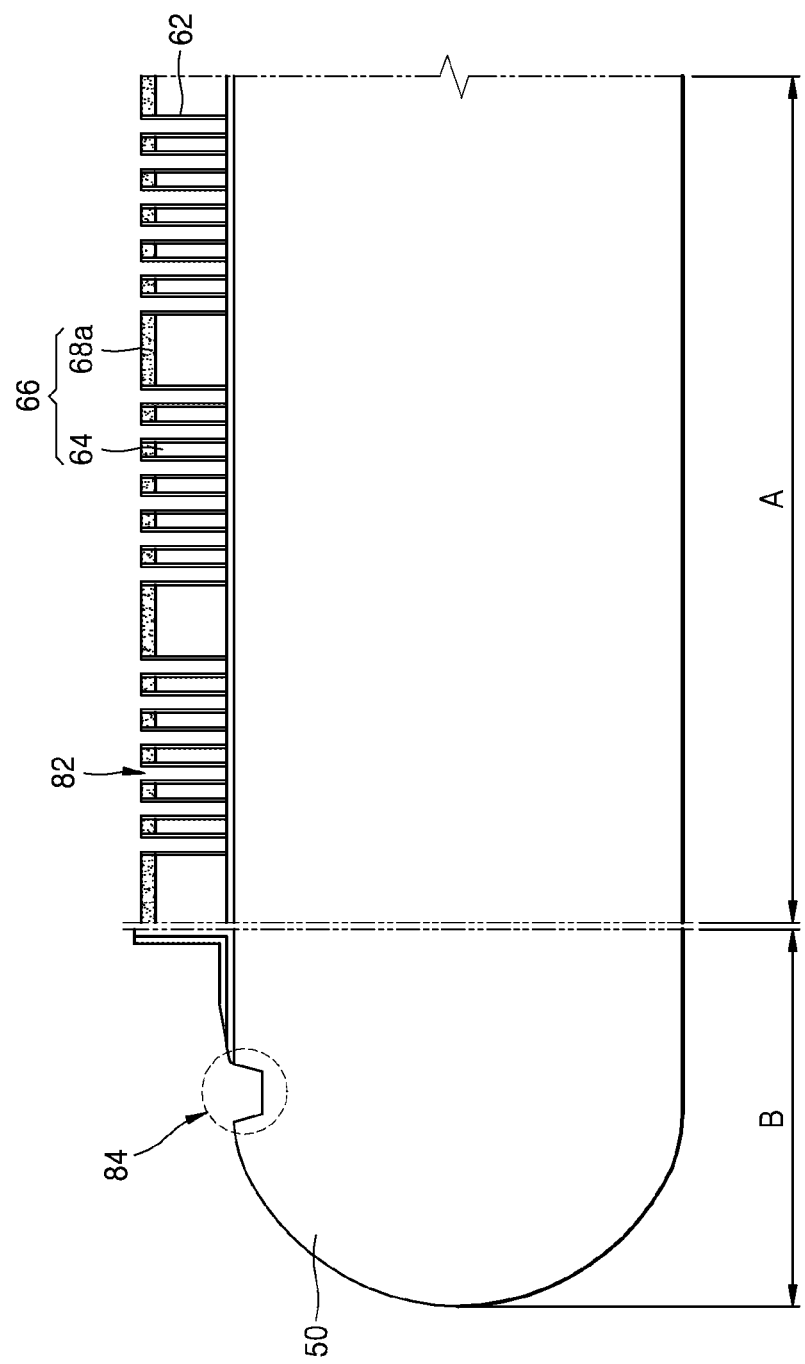

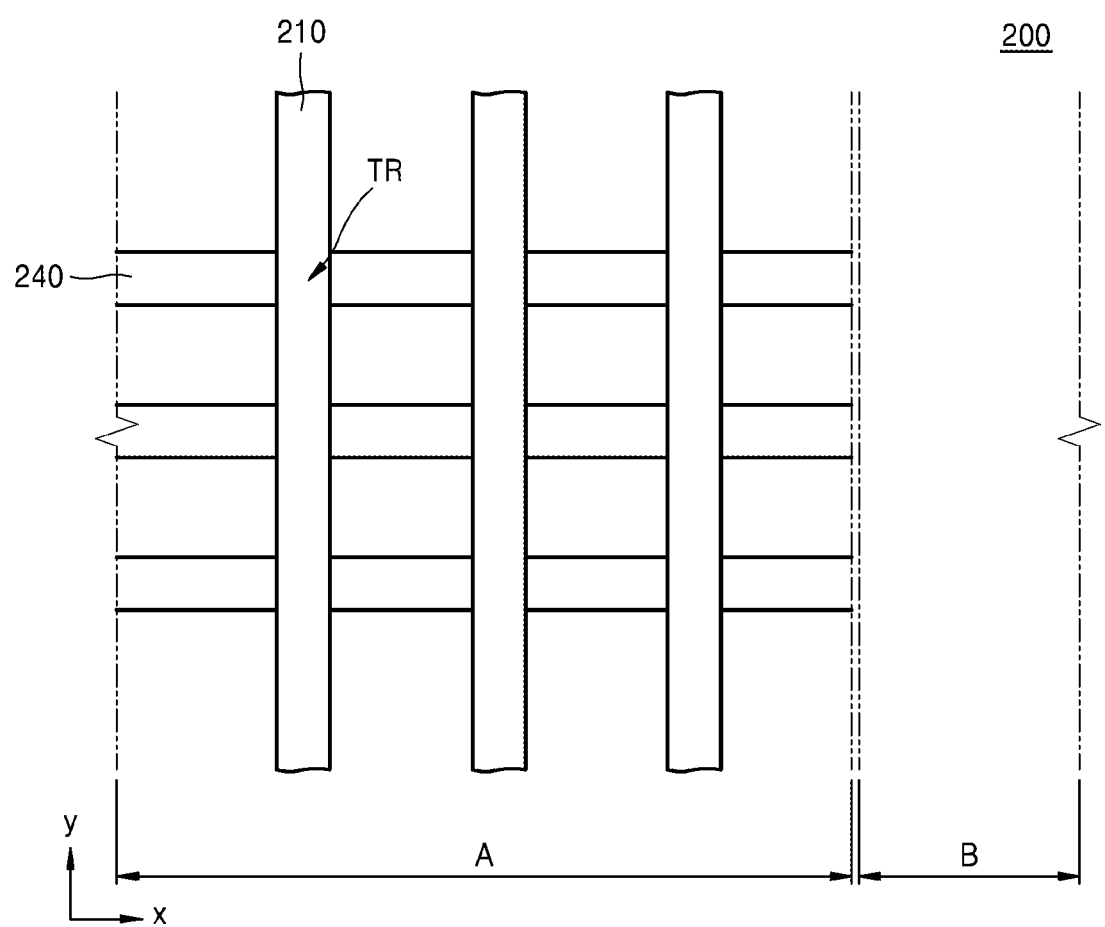

METHOD OF MANUFACTURING SEMICONDUCTOR DEVICE TO PREVENT DEFECTS

CROSS-REFERENCE TO RELATED APPLICATION

This application claims the benefit of Korean Patent Application No. 10-2016-0051099, filed on Apr. 26, 2016, in the Korean Intellectual Property Office, the disclosure of which is incorporated herein in its entirety by reference.

BACKGROUND

The inventive concepts relate to a method of manufacturing a semiconductor device and, more particularly, to a method of manufacturing a semiconductor device to prevent defects.

A gate electrode of a semiconductor device, e.g., a transistor, may be formed of polysilicon. Since polysilicon is durable at a high temperature but has a high resistance value, a semiconductor device using the polysilicon gate electrode has a low operation speed. As such, a replacement metal gate (RMG) process for replacing a polysilicon gate electrode with a metal gate electrode has been disclosed.

In the RMG process, a high-temperature manufacturing process may be performed during which a polysilicon layer is present on a semiconductor substrate and the polysilicon layer may be removed and a metal gate electrode may be provided after the high-temperature manufacturing process.

SUMMARY

The inventive concepts provide a method of manufacturing a semiconductor device to prevent defects from a semiconductor substrate when a replacement metal gate (RMG) process is performed.

According to an aspect of the inventive concepts, there is provided a method of manufacturing a semiconductor device. The method comprises forming dummy gate structures including a dummy gate insulating layer and dummy gate electrodes, on a first region of a semiconductor substrate, the first region including a patterning region The method further comprises forming spacers on two side walls of each of the dummy gate structures. The method further comprises forming an interlayer insulating layer on the semiconductor substrate and the dummy gate structures. The method further comprises forming a protective insulating layer on a second region of the semiconductor substrate, the second region including a non-patterning region. The method further comprises forming a liner layer on the protective insulating layer, planarizing the interlayer insulating layer, forming openings by removing the dummy gate structures, and forming gate structures including a gate insulating layer and metal gate electrodes in the openings.

According to another aspect of the inventive concepts, there is provided a method of manufacturing a semiconductor device, the method comprising forming dummy gate structures including a dummy gate insulating layer and dummy gate electrodes, on a first region of a semiconductor substrate, the first region including a chip region. The method further comprises forming spacers on two side walls of each of the dummy gate structures. The method further comprises forming an interlayer insulating layer on the semiconductor substrate and the dummy gate structures to bury gaps between the spacers. The method further comprises forming a protective insulating layer on a second region of the semiconductor substrate, the second region including a substrate edge region. The method further comprises forming a liner layer on the protective insulating layer, planarizing the interlayer insulating layer by using the liner layer as an etching mask to expose top surfaces of the dummy gate structures, forming openings by removing the dummy gate structures to expose the semiconductor substrate between the spacers, and forming gate structures including a gate insulating layer and metal gate electrodes, in the openings.

According to another example embodiment of the inventive concepts, there is provided a method of manufacturing a semiconductor device, the method comprising forming structures on a first region of a semiconductor substrate, the first region including a die region, and forming an interlayer insulating layer on the semiconductor substrate and the structures. The method further comprises removing the interlayer insulating layer on a second region of the semiconductor substrate, the second region including an edge region, forming a protective insulating layer on the semiconductor substrate, forming a liner layer on the protective insulating layer, removing the liner layer from the first region of the semiconductor substrate, and planarizing the interlayer insulating layer, while leaving the liner layer on the protective insulating layer on the second region of the semiconductor substrate.

BRIEF DESCRIPTION OF THE DRAWINGS

Embodiments of the inventive concepts will be more clearly understood from the following detailed description taken in conjunction with the accompanying drawings in which:

FIGS. 2A to 2H are cross-sectional views for describing a method of manufacturing a semiconductor device, according to other example embodiments of the inventive concepts;

FIG. 3 is a cross-sectional view of a semiconductor device according to a comparative example of FIG. 2H;

FIG. 7 is a plan view of a semiconductor device according to other example embodiment of the inventive concepts;

DETAILED DESCRIPTION OF THE EMBODIMENTS

FIGS. 1A to 1I are cross-sectional views for describing a method of manufacturing a semiconductor device, according to an embodiment of the inventive concepts.

Specifically, FIGS. 1A to 1I are provided to describe a replacement metal gate (RMG) process for replacing polysilicon dummy gate electrodes with metal gate electrodes. For clarity of description, impurity regions, an isolation layer, etc. providable on a semiconductor substrate 10 are not illustrated. In FIGS. 1A to 1I, a first region A may be a patterning region, and a second region B may be a non-patterning region.

Figure 1A:
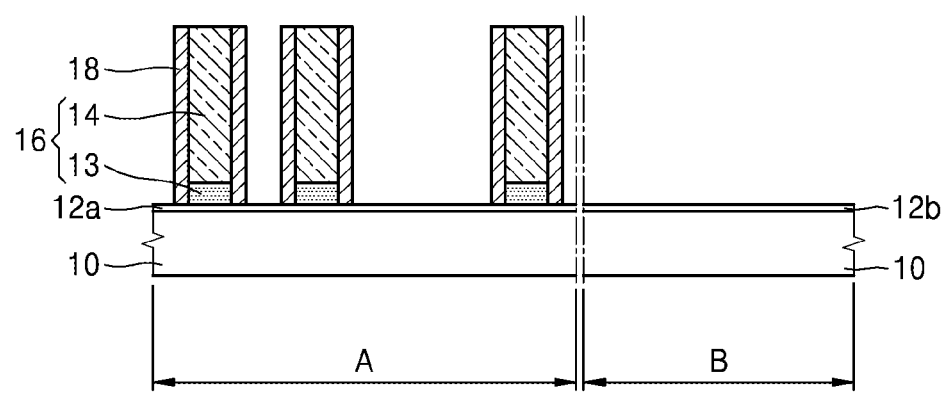
FIGS. 1A to 1I are cross-sectional views for describing a method of manufacturing a semiconductor device, according to example embodiments of the inventive concepts.

Referring to FIG. 1A, base insulating layers 12a and 12b may be provided on the semiconductor substrate 10. The semiconductor substrate 10 may be based on a silicon bulk wafer or a silicon-on-insulator (SOI) wafer. However, the material of the semiconductor substrate 10 is not limited to silicon. For example, the semiconductor substrate 10 may include a group IV semiconductor such as germanium (Ge), a group IV-IV compound semiconductor such as silicon germanium (SiGe) or silicon carbide (SiC), or a group III-V compound semiconductor such as gallium arsenide (GaAs), indium arsenide (InAs), or indium phosphide (InP).

The semiconductor substrate 10 may also be based on a SiGe wafer, an epitaxial wafer, a polished wafer, an annealed wafer, or the like. The semiconductor substrate 10 may be a p-type or n-type substrate. For example, the semiconductor substrate 10 may be a p-type substrate including p-type impurity ions, or an n-type substrate including n-type impurity ions.

The base insulating layers 12a and 12b may be artificially or automatically generated during a manufacturing process. The base insulating layers 12a and 12b may be provided as necessary to protect the semiconductor substrate 10. The base insulating layers 12a and 12b may be silicon oxide layers.

Dummy gate structures 16 and spacers 18 may be provided on the first region A of the semiconductor substrate 10. The dummy gate structures 16 and the spacers 18 may not be provided on the second region B of the semiconductor substrate 10.

The dummy gate structures 16 may include a dummy gate insulating layer 13 and dummy gate electrodes 14. The dummy gate insulating layer 13 may be provided as an amorphous carbon layer (ACL) or a carbon-spin on hardmask (C-SOH) layer having a high content of carbon, and the dummy gate electrodes 14 may be formed of polysilicon. However, the materials of the dummy gate insulating layer 13 and the dummy gate electrodes 14 are not limited to the above-mentioned materials.

The spacers 18 may be provided on two side walls of each of the dummy gate structures 16. The spacers 18 may be provided as an insulating layer, e.g., a silicon nitride layer, a silicon oxynitride layer, or a combination thereof. The spacers 18 may be generated by forming an insulating layer to uniformly cover the dummy gate structures 16, and then removing the insulating layer from top surfaces of the dummy gate structures 16 and top-surface parts of the semiconductor substrate 10 by using dry etching and/or etch back.

Figure 1B:
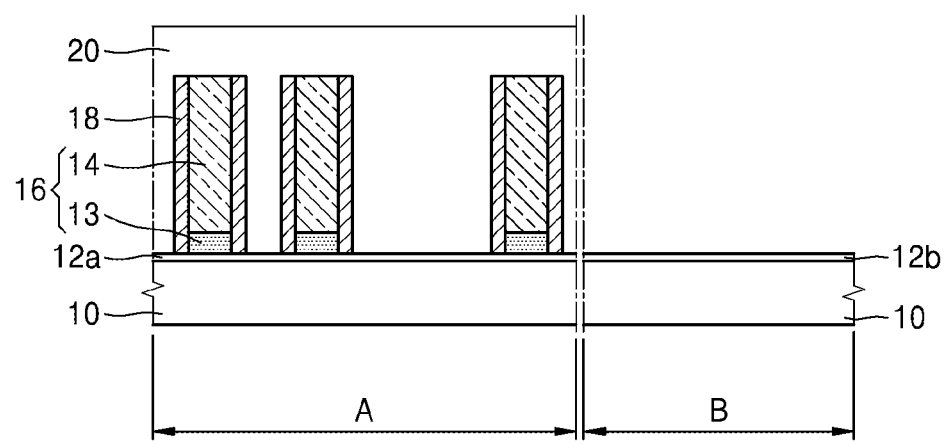

Referring to FIG. 1B, a first interlayer insulating layer 20 is provided on the dummy gate structures 16 and the spacers 18 of the first region A of the semiconductor substrate 10 to bury gaps between the spacers 18. The first interlayer insulating layer 20 may be provided as a silicon oxide layer. The first interlayer insulating layer 20 may be formed of tonen silazene (TOSZ), undoped silicate glass (USG), borosilicate glass (BSG), phosphosilicate glass (PSG), borophosphosilicate glass (BPSG), plasma enhanced tetra ethyl ortho silicate (PRTEOS), fluoride silicate glass (FSG), or the like.

The first interlayer insulating layer 20 may be generated by forming an interlayer insulating layer on both the first region A and the second region B of the semiconductor substrate 10, and then selectively etching the interlayer insulating layer of the second region B by using a photo etching process.

Figure 1C:
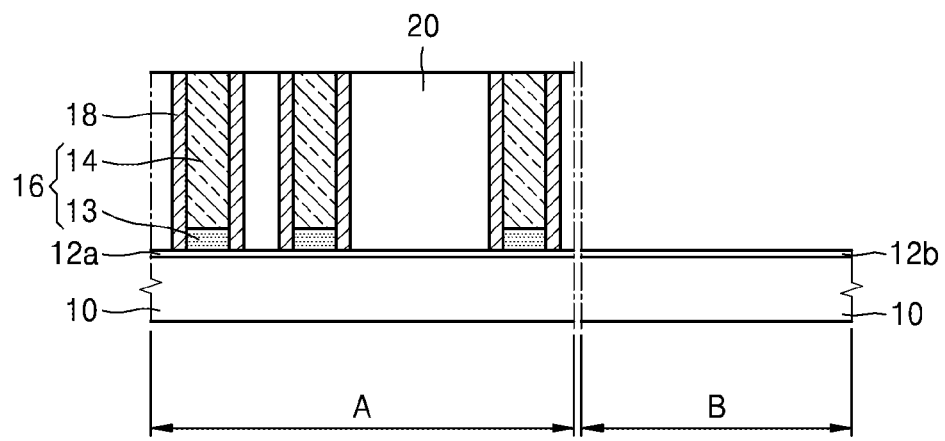

Referring to FIG. 1C, the first interlayer insulating layer 20 provided on the first region A of the semiconductor substrate 10 is etched back or chemical mechanical polishing (CMP)-processed for planarization. As such, top surfaces of the dummy gate structures 16 and the spacers 18 of the first region A of the semiconductor substrate 10 are exposed.

Due to the etch back or CMP process of the first interlayer insulating layer 20, a top surface of the first interlayer insulating layer 20 may have the same level as the top surfaces of the dummy gate structures 16 and the spacers 18. The first interlayer insulating layer 20 may be provided on the semiconductor substrate 10 to bury the gaps between the spacers 18.

Figure 1D:
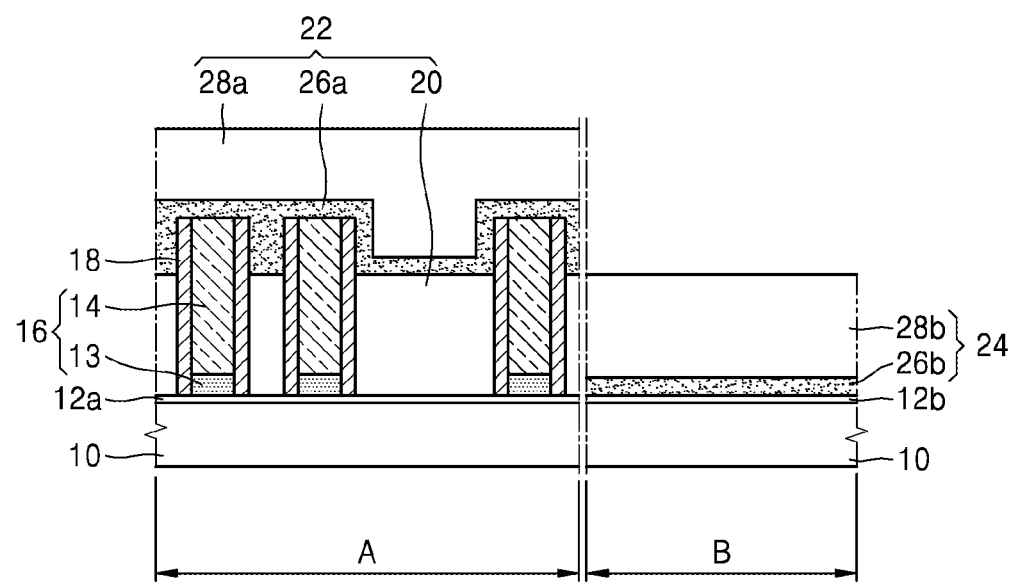

Referring to FIG. 1D, if necessary, the first interlayer insulating layer 20 may be additionally etched back. As such, the top surface of the first interlayer insulating layer 20 may be recessed to a level lower than the level of the top surfaces of the dummy gate structures 16 and the spacers 18 as indicated by reference numeral 24. The additional etch back process of the first interlayer insulating layer 20 may be performed to facilitate a planarization process of a second interlayer insulating layer 26a and a third interlayer insulating layer 28a to be described below.

Subsequently, the second interlayer insulating layer 26a and the third interlayer insulating layer 28a are provided on the first interlayer insulating layer 20 of the first region A of the semiconductor substrate 10. As such, the first interlayer insulating layer 20, the second interlayer insulating layer 26a, and the third interlayer insulating layer 28a configure an interlayer insulating layer 22 for insulating the dummy gate structures 16 and the spacers 18 from each other.

Before a protective insulating layer 24 to be described below is provided, the second region B of the semiconductor substrate 10, i.e., the non-patterning region, has a lower height from the semiconductor substrate 10 compared to the first region A of the semiconductor substrate 10, i.e., the patterning region, and thus a step height is provided. To remove the step height, a first protective insulating layer 26b and a second protective insulating layer 28b are sequentially provided on the base insulating layer 12b of the second region B of the semiconductor substrate 10. The first protective insulating layer 26b and the second protective insulating layer 28b configure the protective insulating layer 24 provided to protect the second region B of the semiconductor substrate 10. The second interlayer insulating layer 26a and the first protective insulating layer 26b may be formed of a material having a slower etching or polishing speed compared to the third interlayer insulating layer 28a and the second protective insulating layer 28b. The second interlayer insulating layer 26a and the first protective insulating layer 26b may be provided as a silicon nitride layer, a silicon oxynitride layer, or a combination thereof. The second interlayer insulating layer 26a and the first protective insulating layer 26b may be formed of the same material as the spacers 18. The third interlayer insulating layer 28a and the second protective insulating layer 28b may be provided as a silicon oxide layer.

The second interlayer insulating layer 26a and the first protective insulating layer 26b may be simultaneously and respectively provided on the first region A and the second region B of the semiconductor substrate 10. The third interlayer insulating layer 28a and the second protective insulating layer 28b may be simultaneously and respectively provided on the first region A and the second region B of the semiconductor substrate 10.

Figure 1E:
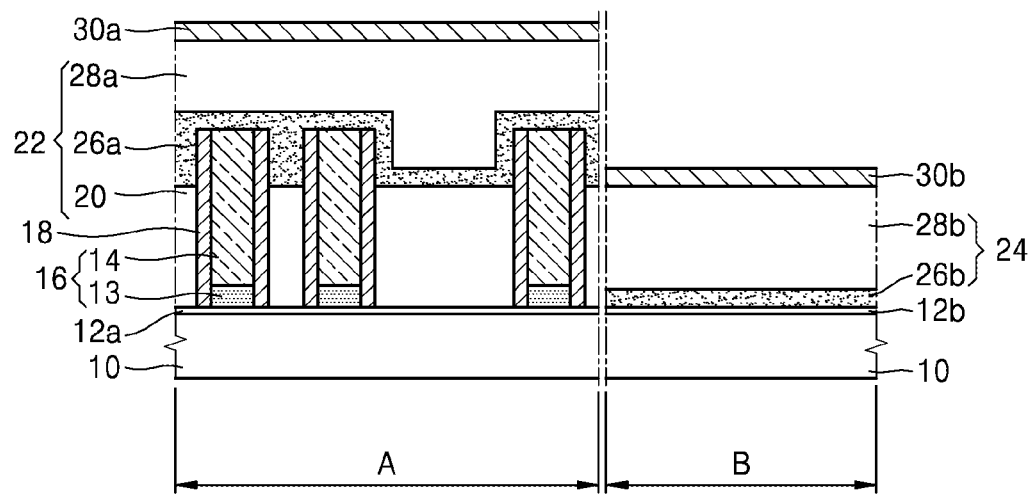
Figure 1F:
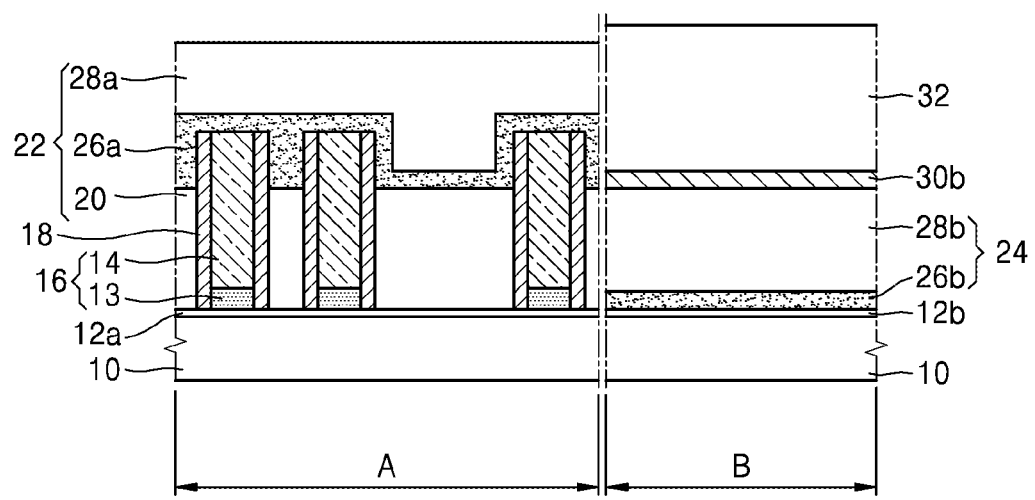

Referring to FIGS. 1E and 1F, liner layers 30a and 30b are provided on the first region A and the second region B of the semiconductor substrate 10 as illustrated in FIG. 1E. In other words, the liner layer 30a is provided on the third interlayer insulating layer 28a. The liner layer 30b is provided on the second protective insulating layer 28b.

The liner layers 30a and 30b may be formed of a material having a slower etching or polishing speed compared to the interlayer insulating layer 22. The liner layers 30a and 30b may be provided as polysilicon layers or silicon oxycarbonitride (SiOCN) layers.

A mask layer 32 is provided on the liner layer 30b of the second region B of the semiconductor substrate 10 as illustrated in FIG. 1F. The mask layer 32 may be provided as a photoresist layer by using a photo etching process.

Thereafter, the liner layer 30a of the first region A of the semiconductor substrate 10 illustrated in FIG. 1E is removed by using the mask layer 32 as an etching mask. Then, only the liner layer 30b remains on the second protective insulating layer 28b of the second region B of the semiconductor substrate 10.

Figure 1G:
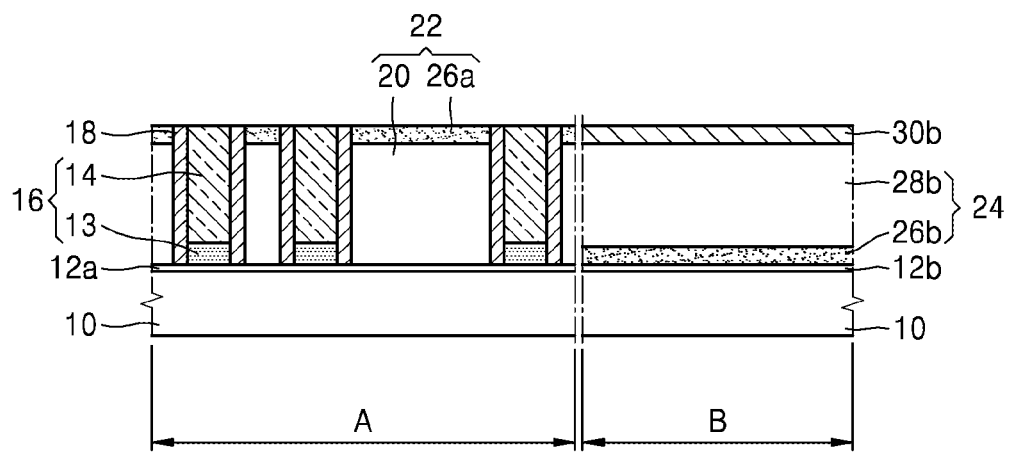

Referring to FIG. 1G, the mask layer 32 of the second region B of the semiconductor substrate 10 is removed. Thereafter, the interlayer insulating layer 22, i.e., the third interlayer insulating layer 28a (see FIG. 1F) and the second interlayer insulating layer 26a (see FIG. 1F), is etched back or CMP-processed for planarization to expose the top surfaces of the dummy gate structures 16 and the spacers 18. In this case, the liner layer 30b provided on the second protective insulating layer 28b of the second region B of the semiconductor substrate 10 is used as an etching mask.

When the third interlayer insulating layer 28a (see FIG. 1F) and the second interlayer insulating layer 26a (see FIG. 1F) are planarized, if necessary, upper parts of the dummy gate structures 16 and the spacers 18 may also be etched back or CMP-processed as illustrated in FIG. 1G. As such, the height of the dummy gate structures 16 and the spacers 18 may be lowered.

Due to the above-described planarization process, the first interlayer insulating layer 20 may be filled between the dummy gate structures 16 and the spacers 18 of the first region A of the semiconductor substrate 10, and the second interlayer insulating layer 26a may remain on the first interlayer insulating layer 20 to have the same level as the dummy gate structures 16 and the spacers 18. The protective insulating layer 24 of the second region B of the semiconductor substrate 10 may not be damaged due to the liner layer 30b.

Figure 1H:
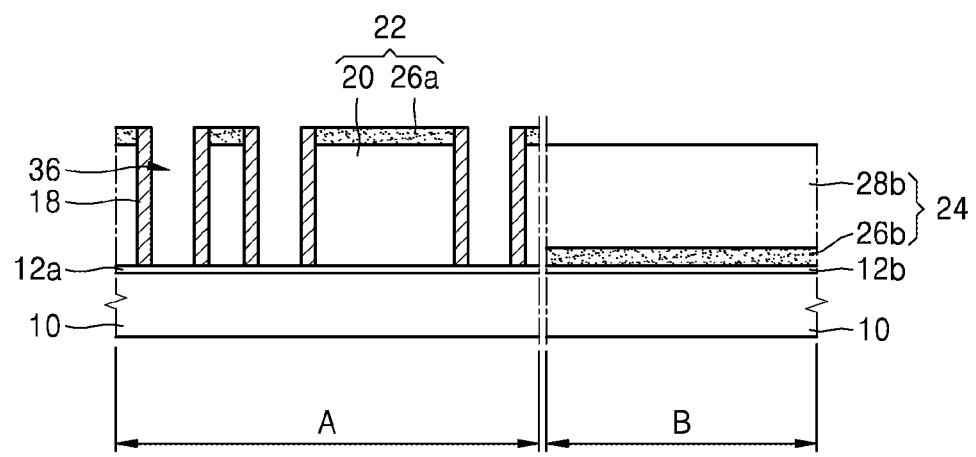

Referring to FIG. 1H, the liner layer 30b (see FIG. 1G) provided on the protective insulating layer 24 of the second region B of the semiconductor substrate 10 is removed to facilitate a subsequent process for removing the dummy gate structures 16.

Thereafter, the dummy gate structures 16 provided on the first region A of the semiconductor substrate 10 are removed to provide openings 36 to expose the semiconductor substrate 10 between the spacers 18. When the dummy gate structures 16 provided on the first region A of the semiconductor substrate 10, e.g., the dummy gate electrodes 14 formed of polysilicon, are removed, the second region B of the semiconductor substrate 10 may be protected by the second protective insulating layer 28b provided as a silicon oxide layer having etch selectivity over polysilicon.

Figure 1I:
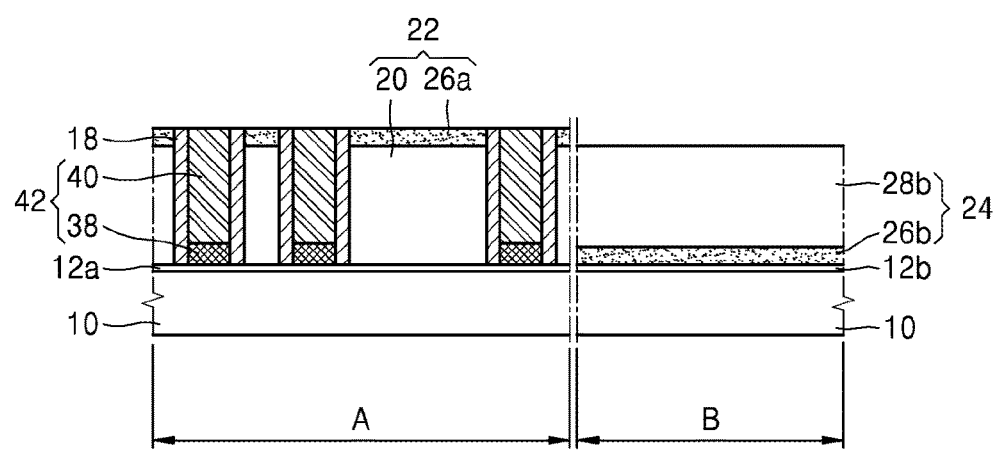

Referring to FIG. 1I, gate structures 42 including a gate insulating layer 38 and metal gate electrodes 40 are provided in the openings 36. The metal gate electrodes 40 may be the afore-described RMG electrodes. The gate structures 42 may be generated by forming an insulating layer and a metal layer in the openings 36, and then planarizing the insulating layer and the metal layer to expose a top surface of the interlayer insulating layer 22.

The gate insulating layer 38 may be provided as at least one selected among a silicon oxide layer, a silicon nitride layer, a silicon oxynitride layer, an oxide/nitride/oxide (ONO) layer, and a high-k dielectric film having a higher dielectric constant compared to the silicon oxide layer. For example, the gate insulating layer 38 may have a dielectric constant of about 10 to 25.

Specifically, for example, the gate insulating layer 38 may be formed of metal oxide such as hafnium oxide ($HfO_2$), zirconium oxide ($ZrO_2$), titanium oxide ($TiO_2$), or aluminum oxide ($Al_2O_3$), or silicate or aluminate thereof.

Alternatively, the gate insulating layer 38 may be formed of metal oxynitride such as aluminum oxynitride (AlON), zirconium oxynitride (ZrON), hafnium oxynitride (HfON), lanthanum oxynitride (LaON), or yttrium oxynitride (YON), or silicate or aluminate thereof. Otherwise, the gate insulating layer 38 may be formed of perovskite-type oxide, a niobate or tantalate system material, a tungsten-bronze system material, a bismuth (Bi)-layered perovskite system material, or the like.

The gate insulating layer 38 may be generated using various deposition methods such as chemical vapor deposition (CVD), low pressure CVD (LPCVD), atmospheric pressure CVD (APCVD), low temperature CVD (LTCVD), plasma enhanced CVD (PECVD), atomic layer CVD (AL-CVD), atomic layer deposition (ALD), and physical vapor deposition (PVD).

The metal gate electrodes 40 may be provided as a single metal layer or at least two metal layers. For example, the metal gate electrodes 40 may include a barrier metal layer and an electrode metal layer. Herein, the barrier metal layer may include at least one material selected among tungsten (W), tungsten nitride (WN), tungsten carbide (WC), titanium (Ti), titanium nitride (TiN), tantalum (Ta), tantalum nitride (TaN), ruthenium (Ru), cobalt (Co), manganese (Mn), nickel (Ni), and nickel boron (NiB), and may be provided as a monolayer or a multilayer.

The electrode metal layer may include at least one selected among aluminum (Al), copper (Cu), and tungsten (W). For example, the electrode metal layer may be formed of copper (Cu), copper tin (CuSn), copper manganese (CuMg), copper nickel (CuNi), copper zinc (CuZn), copper palladium (CuPd), copper gold (CuAu), copper rhenium (CuRe), copper tungsten CuW, tungsten (W), or a W alloy, but is not limited thereto. Alternatively, the electrode metal layer may include one or more of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr), and may be provided as a monolayer or a multilayer. The barrier metal layer and the electrode metal layer may be generated using a PVD or CVD process, but is not limited thereto.

Figure 2D:
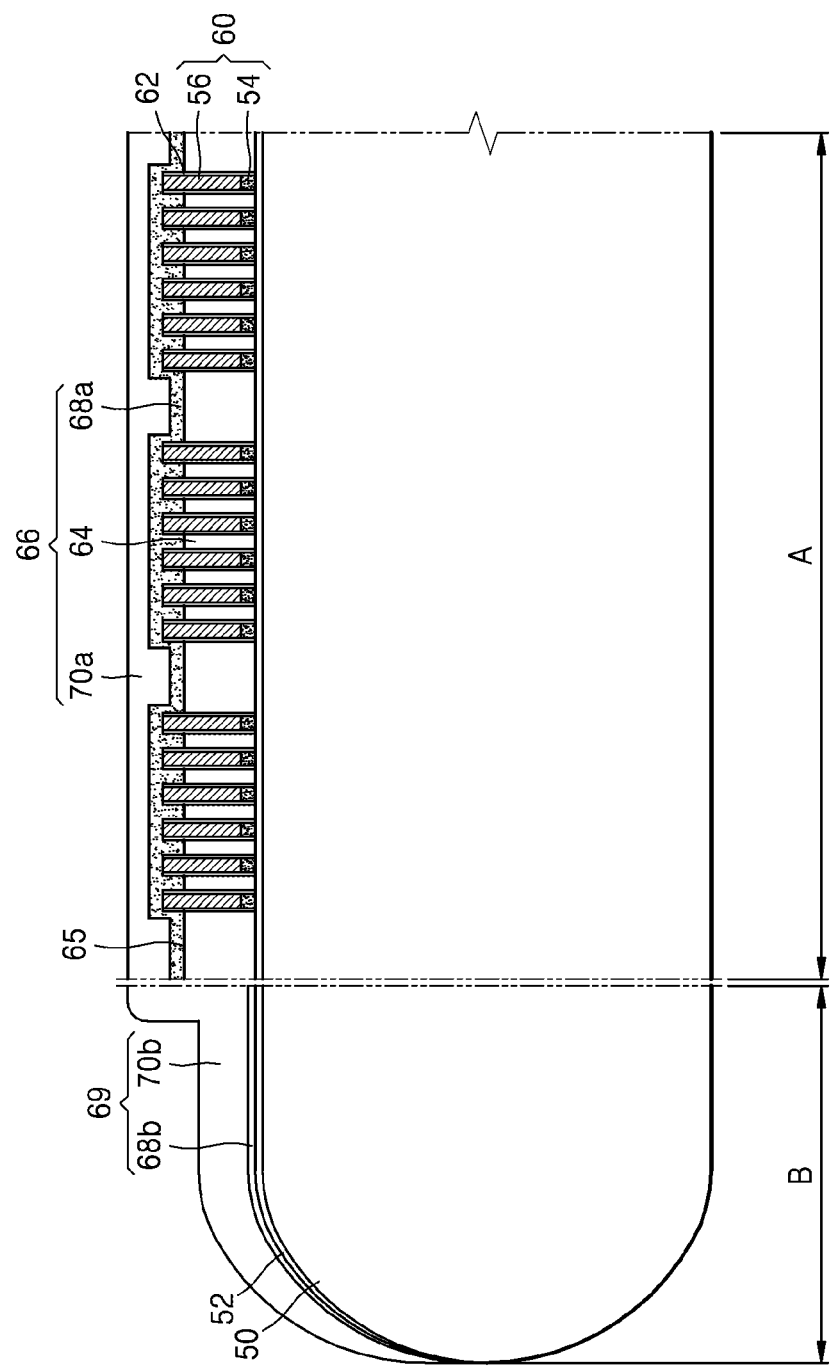
Figure 2E:
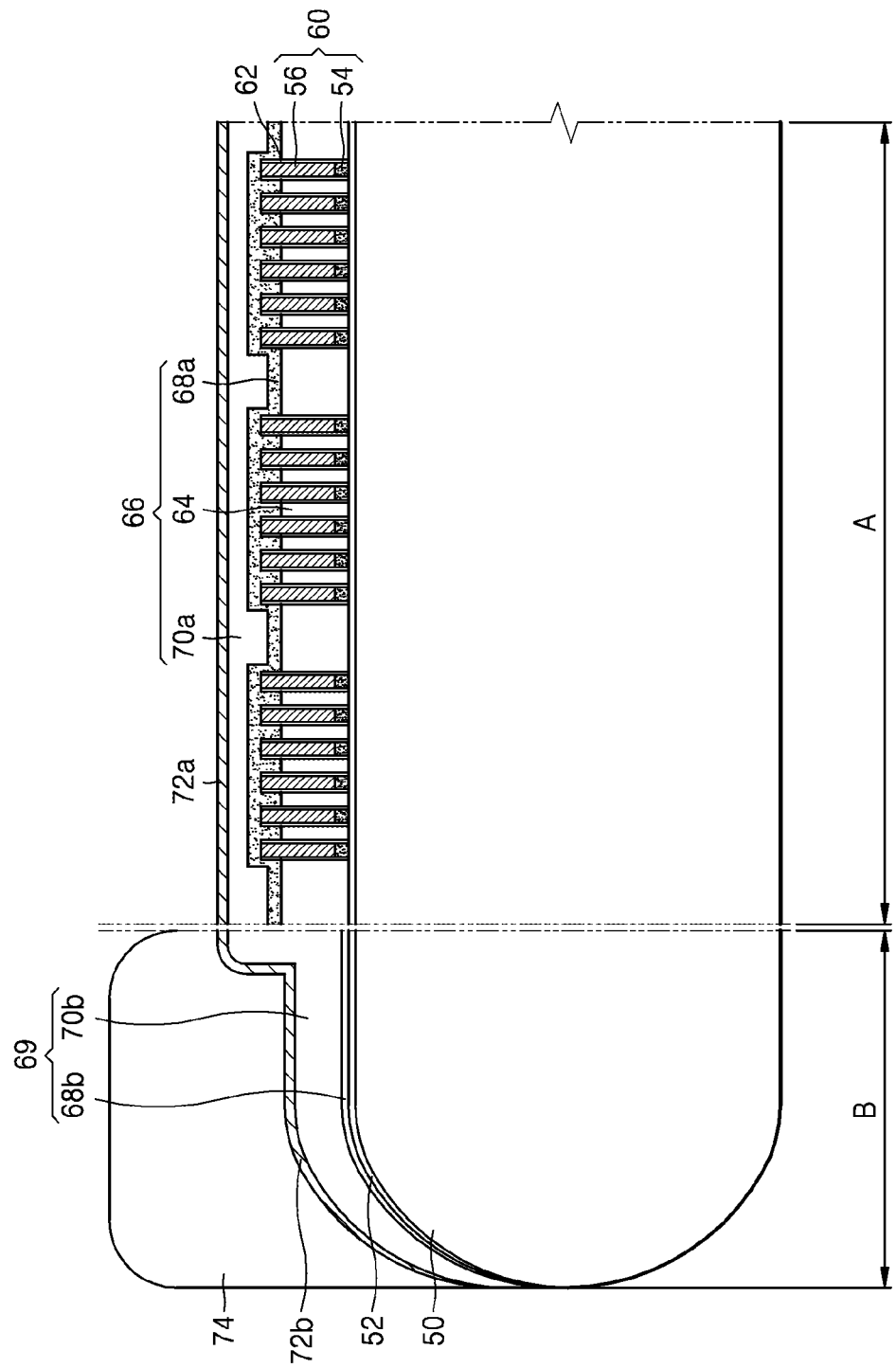
Figure 2F:
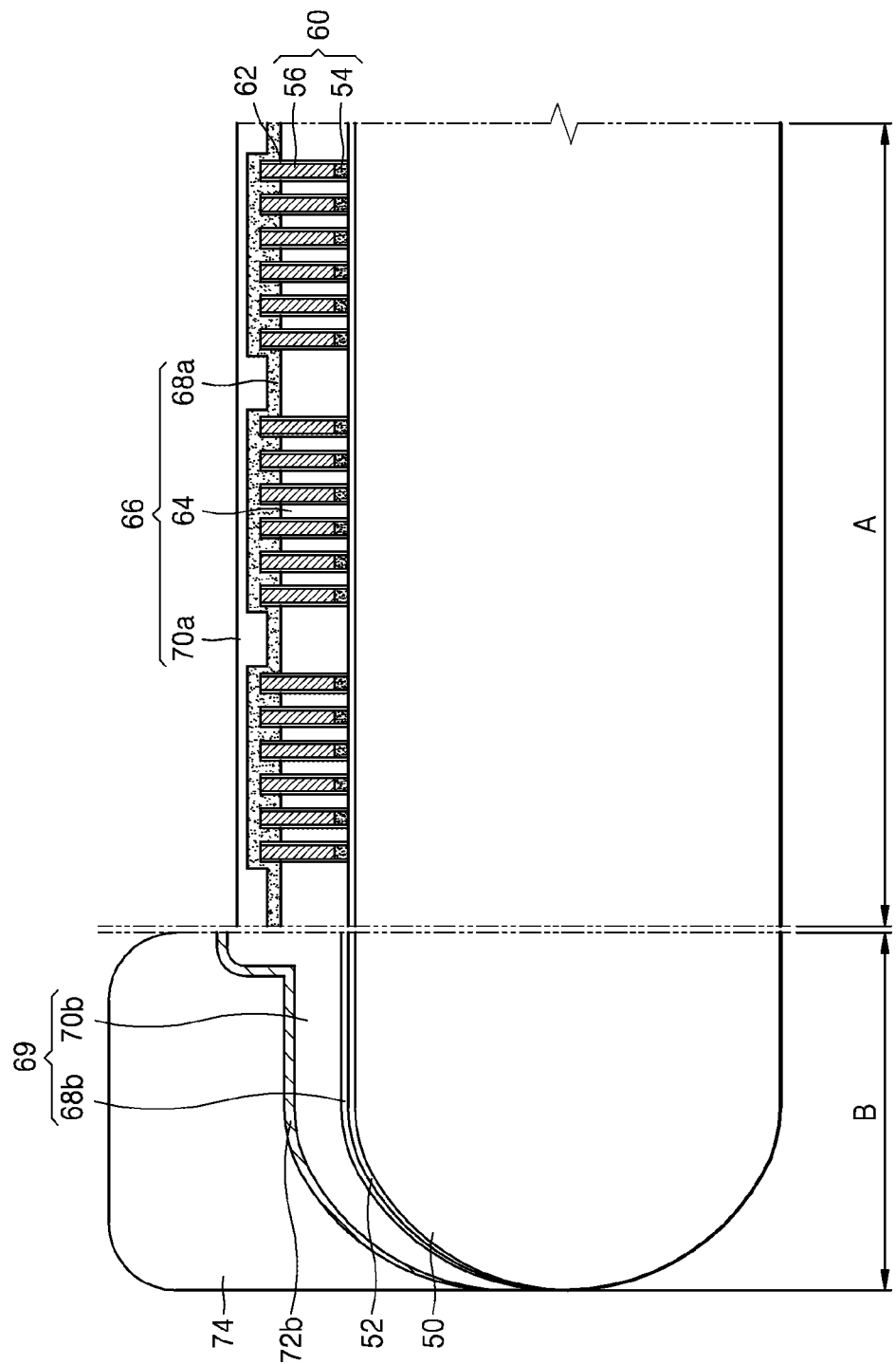
Figure 2H:
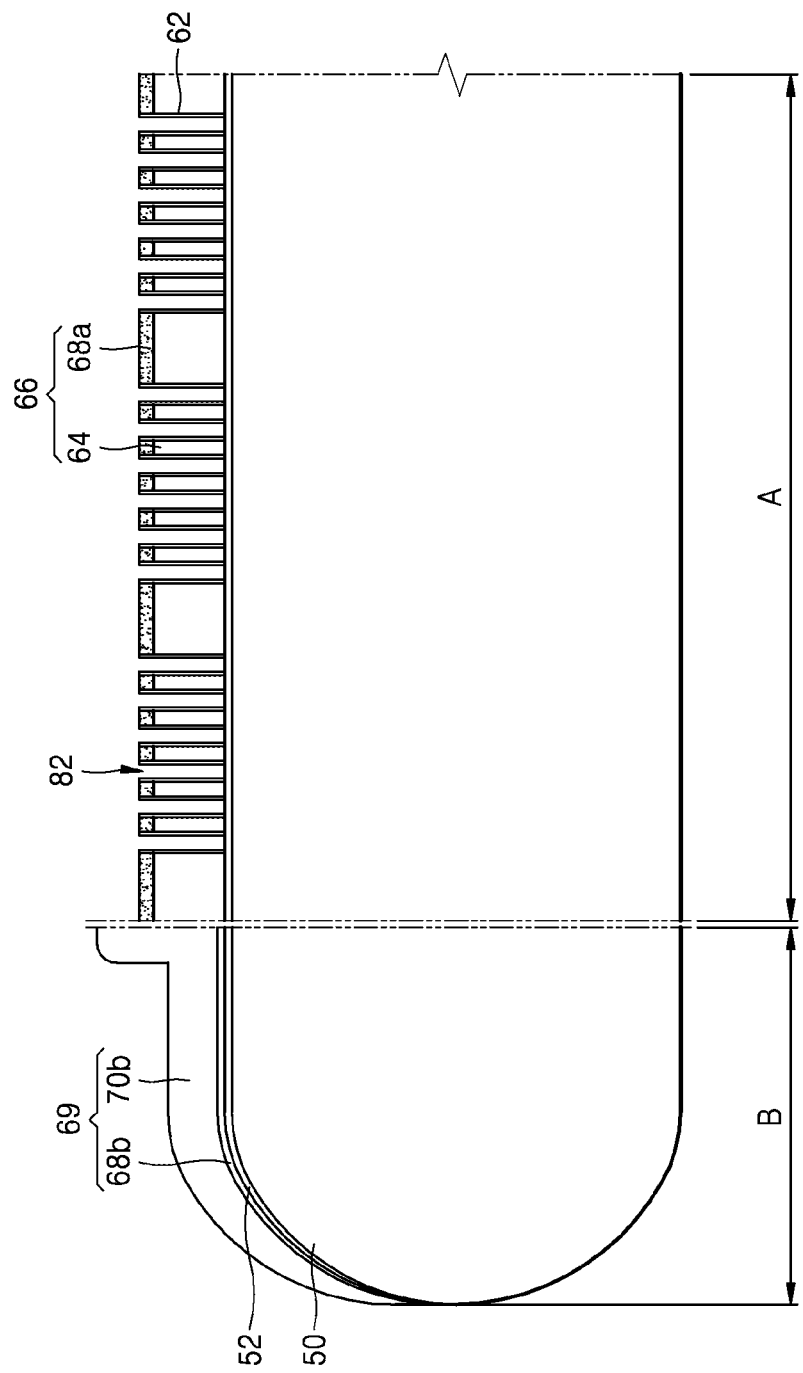

FIGS. 2A to 2H are cross-sectional views for describing a method of manufacturing a semiconductor device, according to other example embodiments of the inventive concepts, and FIG. 3 is a cross-sectional view of a semiconductor device according to a comparative example of FIG. 2H.

Specifically, FIGS. 2A to 2H are provided to describe a replacement metal gate (RMG) process for replacing polysilicon dummy gate electrodes with metal gate electrodes. For clarity of description, an isolation layer, etc. on a semiconductor substrate 50 are not illustrated.

In FIGS. 2A to 2H, a first region A may be a chip region, and a second region B may be a substrate (wafer) edge region on which no chip is provided. In FIGS. 2A to 2H, the descriptions already given above in relation to FIGS. 1A to 1I are briefly provided or omitted herein. If the substrate 50 is a wafer, the first region may also be called a die region.

Referring to FIG. 2A, a base insulating layer 52 may be provided on the semiconductor substrate 50. The semiconductor substrate 50 may correspond to the semiconductor substrate 10 of FIG. 1A and thus a description of a material thereof is omitted herein. A surface of the first region A of the semiconductor substrate 50, i.e., the chip region, may be flat, and the second region B of the semiconductor substrate 50, i.e., the substrate edge region, may be rounded. The base insulating layer 52 may correspond to the base insulating layers 12a and 12b of FIG. 1A, and thus a description of a material and a function thereof is omitted herein.

Dummy gate structures 60' and spacers 62' may be provided on the first region A of the semiconductor substrate 50. The dummy gate structures 60' and the spacers 62' may not be provided on the second region B of the semiconductor substrate 50. The dummy gate structures 60' may include a dummy gate insulating layer 54, dummy gate electrodes 56, and a hard mask layer 58.

The dummy gate structures 60' may correspond to the dummy gate structures 16 of FIG. 1A. The dummy gate insulating layer 54 and the dummy gate electrodes 56 may correspond to the dummy gate insulating layer 13 and the dummy gate electrodes 14 of FIG. 1A, respectively. As such, a description of materials of the dummy gate insulating layer 54 and the dummy gate electrodes 56 is omitted herein. The hard mask layer 58 is used to generate the dummy gate insulating layer 54 and the dummy gate electrodes 56, and may be provided as a silicon nitride layer or a silicon oxynitride layer.

The spacers 62' may be provided on two side walls of each of the dummy gate structures 60'. The spacers 62' may correspond to the spacers 18 of FIG. 1A and thus a description thereof is omitted herein.

Referring to FIGS. 2B and 2C, a first interlayer insulating layer 64 is provided on the dummy gate structures 60' and the spacers 62' of the first region A of the semiconductor substrate 50 to bury gaps between the spacers 62' as illustrated in FIG. 2B. The first interlayer insulating layer 64 corresponds to the first interlayer insulating layer 20 of FIG. 1B and thus a description of a material, etc. thereof is omitted herein.

Subsequently, as illustrated in FIGS. 2B and 2C, the first interlayer insulating layer 64, the hard mask layer 58 of the dummy gate structures 60', and upper parts of the spacers 62', which are provided on the first region A of the semiconductor substrate 50, are etched back or CMP-processed for planarization.

As such, the dummy gate structures 60 including the dummy gate insulating layer 54 and the dummy gate electrodes 56 and the spacers 62 provided on the two side walls of each of the dummy gate structures 60 may be provided on the first region A of the semiconductor substrate 50. Top surfaces of the dummy gate structures 60 and the spacers 62 may be exposed.

Due to the planarization process of the first interlayer insulating layer 64, the hard mask layer 58 of the dummy gate structures 60', and the upper parts of the spacers 62', a top surface of the first interlayer insulating layer 64 may have the same level as the top surfaces of the dummy gate structures 60 and the spacers 62. The first interlayer insulating layer 64 may be provided on the semiconductor substrate 50 to bury the gaps between the spacers 62.

Referring to FIG. 2D, if necessary, the first interlayer insulating layer 64 may be additionally etched back. As such, the top surface of the first interlayer insulating layer 64 may be recessed to a level lower than the level of the top surfaces of the dummy gate structures 60 and the spacers 62 as indicated by reference numeral 65.

Subsequently, a second interlayer insulating layer 68a and a third interlayer insulating layer 70a are provided on the first interlayer insulating layer 64 of the first region A of the semiconductor substrate 50. The second interlayer insulating layer 68a and the third interlayer insulating layer 70a may correspond to the second interlayer insulating layer 26a and the third interlayer insulating layer 28a of FIG. 1D. As such, the first interlayer insulating layer 64, the second interlayer insulating layer 68a, and the third interlayer insulating layer 70a configure an interlayer insulating layer 66 for insulating the dummy gate structures 60 and the spacers 62 from each other.

Before a protective insulating layer 69 to be described below is provided, the second region B of the semiconductor substrate 50, i.e., the substrate edge region, has a lower height from the semiconductor substrate 50 compared to the first region A of the semiconductor substrate 50, i.e., the chip region, and thus a step height is provided therebetween. To remove the step height, a first protective insulating layer 68b and a second protective insulating layer 70b are sequentially provided on the base insulating layer 52 of the second region B of the semiconductor substrate 50. The first protective insulating layer 68b and the second protective insulating layer 70b configure the protective insulating layer 69 provided to protect the second region B of the semiconductor substrate 50. The first protective insulating layer 68b and the second protective insulating layer 70b correspond to the first protective insulating layer 26b and the second protective insulating layer 28b of FIG. 1D and thus a description of materials, forming methods, etc. thereof is omitted herein.

Referring to FIGS. 2E and 2F, liner layers 72a and 72b are provided on the first region A and the second region B of the semiconductor substrate 50 as illustrated in FIG. 2E. In other words, the liner layer 72a is provided on the third interlayer insulating layer 70a. The liner layer 72b is provided on the second protective insulating layer 70b. The liner layers 72a and 72b may correspond to the liner layers 30a and 30b of FIG. 1E and thus a description of a material, etc. thereof is omitted herein. The liner layers 72a and 72b may be formed of a material having a slower etching or polishing speed compared to the interlayer insulating layer 66.

A mask layer 74 is provided on the liner layer 72b of the second region B of the semiconductor substrate 50. The mask layer 74 may be provided as a photoresist layer by using a photo etching process. Thereafter, the liner layer 72a of the first region A of the semiconductor substrate 50 is etched and removed by using the mask layer 74 as an etching mask as illustrated in FIG. 2F. Then, only the liner layer 72b remains on the second protective insulating layer 70b of the second region B of the semiconductor substrate 50.

Referring to FIG. 2G, the mask layer 74 of the second region B of the semiconductor substrate 50 is removed. Thereafter, the interlayer insulating layer 66, i.e., the third interlayer insulating layer 70a (see FIG. 2F) and the second interlayer insulating layer 68a (see FIG. 2F), is etched back or CMP-processed for planarization to expose the top surfaces of the dummy gate structures 60 and the spacers 62. In this case, the liner layer 72b provided on the second protective insulating layer 70b of the second region B of the semiconductor substrate 50 is used as an etching mask.

When the third interlayer insulating layer 70a (see FIG. 2F) and the second interlayer insulating layer 68a (see FIG. 2F) are planarized, if necessary, upper parts of the dummy gate structures 60 and the spacers 62 may also be etched back or CMP-processed as illustrated in FIG. 2G. As such, the height of the dummy gate structures 60 and the spacers 62 may be lowered.

Due to the above-described planarization process, the first interlayer insulating layer 64 may be filled between the dummy gate structures 60 and the spacers 62 of the first region A of the semiconductor substrate 50, and the second interlayer insulating layer 68a may remain on the first interlayer insulating layer 64 to have the same level as the dummy gate structures 60 and the spacers 62. The protective insulating layer 69 of the second region B of the semiconductor substrate 50 may not be damaged due to the liner layer 72b.

Referring to FIG. 2H, the liner layer 72b (see FIG. 2G) provided on the protective insulating layer 69 of the second region B of the semiconductor substrate 50 is removed. Thereafter, the dummy gate structures 60 provided on the first region A of the semiconductor substrate 50 are removed to provide openings 82 to expose the semiconductor substrate 50 between the spacers 62.

When the dummy gate structures 60 provided on the first region A of the semiconductor substrate 50, e.g., the dummy gate electrodes 56 formed of polysilicon, are removed, the second region B of the semiconductor substrate 50 may be protected by the second protective insulating layer 70b provided as a silicon oxide layer having etch selectivity over polysilicon.

On the contrary, if no protective insulating layer is provided on the second region B of the semiconductor substrate 50 as illustrated in FIG. 3, when the dummy gate structures 60 provided on the first region A of the semiconductor substrate 50, e.g., the dummy gate electrodes 56 formed of polysilicon, are removed, a defect 84 may be generated in the semiconductor substrate 50. The defect 84 may cause a serious problem during a semiconductor device manufacturing process.

Subsequently, the gate structures 42 (see FIG. 1I) including the gate insulating layer 38 (see FIG. 1I) and the metal gate electrodes 40 (see FIG. 1I) may be provided in the openings 82 as described above in relation to FIG. 1I. A description of a material of the gate structures 42 is given above in relation to FIG. 1I and thus is omitted herein.

A description is now given of semiconductor devices manufactured using the methods of FIGS. 1A to 1I, and 2A to 2H, and manufacturing methods thereof.

Figure 4:
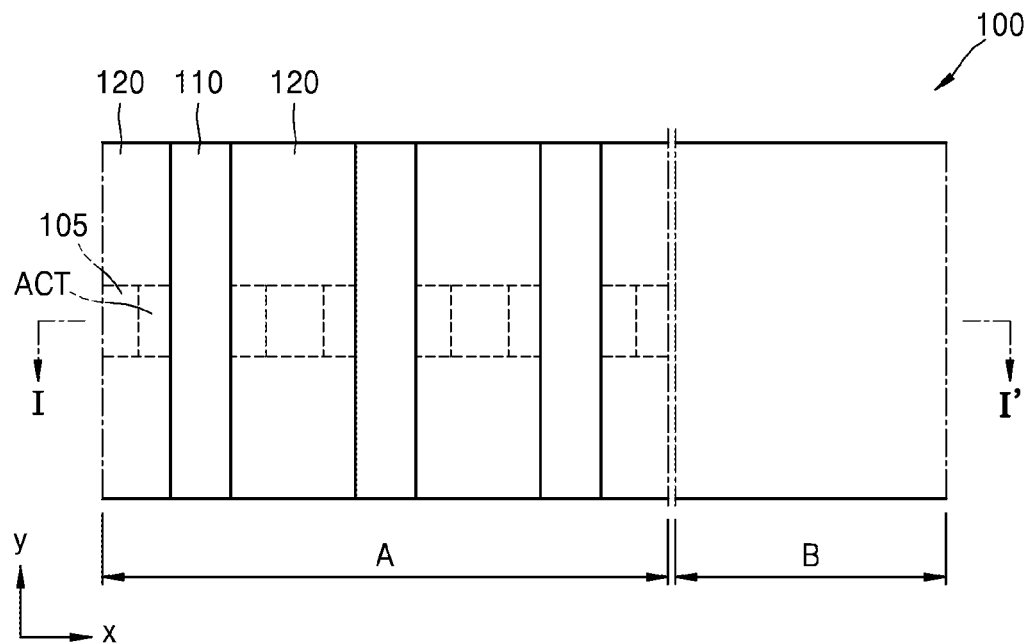
FIG. 4 is a plan view of a semiconductor device according to example embodiments of the inventive concepts.
Figure 5:
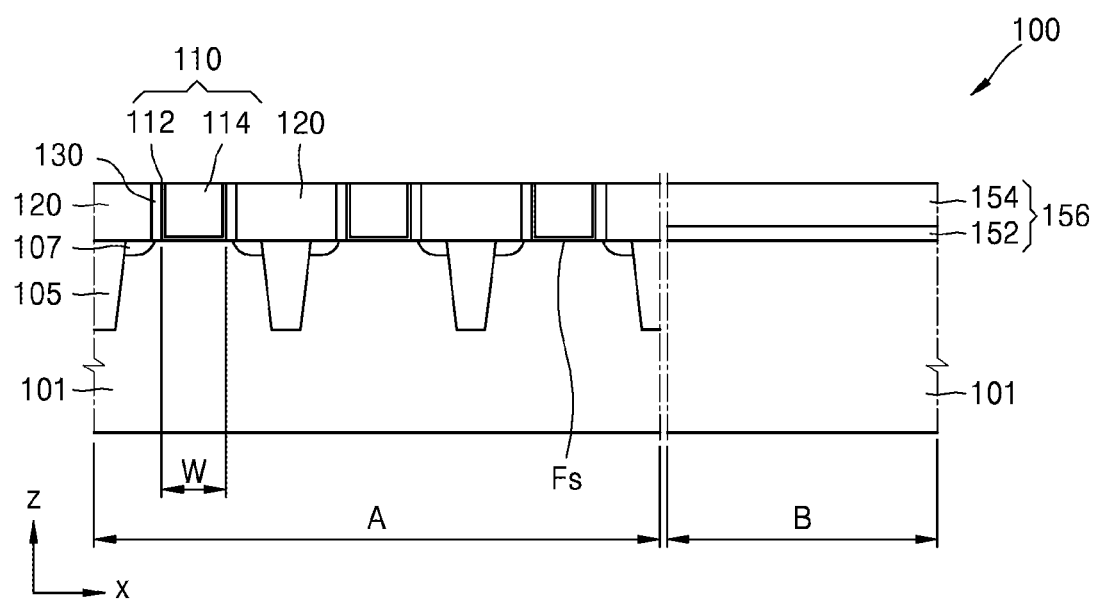
FIG. 5 is a cross-sectional view taken along line I-I' of the semiconductor device of FIG. 4.

FIG. 4 is a plan view of a semiconductor device 100 according to example embodiments of the inventive concepts, and FIG. 5 is a cross-sectional view taken along line I-I' of the semiconductor device 100 of FIG. 4.

Specifically, in FIGS. 4 and 5, the descriptions already given above in relation to FIGS. 1A to 1I, and 2A to 2H are briefly provided or omitted herein. A semiconductor substrate 101 may include a first region A and a second region B. The first region A may be a patterning region or a chip region, and the second region B may be a non-patterning region or a substrate edge region.

The semiconductor device 100 may include the semiconductor substrate 101, gate structures 110, an interlayer insulating layer 120, spacers 130, a protective insulating layer 156, etc. Active regions ACT extending in a first direction (x direction) may be defined on the semiconductor substrate 101 by an isolation layer 105. The gate structures 110 extending in a second direction (y direction) may be provided on the first region A. The gate structures 110 may correspond to the gate structures 42 of FIG. 1I.

Although the active regions ACT perpendicularly cross the gate structures 110 in FIG. 4, the active regions ACT and the gate structures 110 may non-perpendicularly cross each other. In addition, although a single active region ACT crosses a single gate structure 110 in FIG. 4, multiple active regions ACT may cross a single gate structure 110.

The semiconductor substrate 101 corresponds to the semiconductor substrate 10 or 50 of FIGS. 1A to 1I, or 2A to 2H and thus a description thereof is omitted herein. The semiconductor substrate 101 may include the active regions ACT provided at an upper part thereof and defined by the isolation layer 105, e.g., a shallow trench isolation (STI) layer. The active regions ACT may include impurity regions generated by injecting impurity ions, i.e., a dopant, into the semiconductor substrate 101 to a high density. For example, the active regions ACT may include source/drain regions 107 generated by injecting a dopant into the semiconductor substrate 101 to a density equal to or higher than $1E20/cm^3$.

The isolation layer 105 defines the active regions ACT and may be provided to surround the active regions ACT. The isolation layer 105 may be provided between the active regions ACT to electrically separate the active regions ACT from each other. The isolation layer 105 may include at least one of, for example, a silicon oxide layer, a silicon nitride layer, a silicon oxynitride layer, and a combination thereof.

The gate structures 110 may be provided on a top surface Fs of the semiconductor substrate 101. The gate structures 110 may extend across the active regions ACT in the second direction (y direction) on the semiconductor substrate 101, and may be spaced apart from each other in the first direction (x direction) by the interlayer insulating layer 120. The interlayer insulating layer 120 may correspond to the interlayer insulating layer 22 of FIG. 1I or the interlayer insulating layer 66 of FIG. 2H.

The spacers 130 may be provided between the gate structures 110 and the interlayer insulating layer 120. The spacers 130 may correspond to the spacers 18 of FIG. 1I or the spacers 62 of FIG. 2H. The interlayer insulating layer 120 and the spacers 130 may be formed of materials having different etch selectivity values. For example, when the interlayer insulating layer 120 is provided as a silicon oxide layer, the spacers 130 may be provided as a silicon nitride layer.

The gate structures 110 may include a gate insulating layer 112 and metal gate electrodes 114. The gate insulating layer 112 may be provided between the metal gate electrodes 114 and the active regions ACT. The width of the gate structures 110 in the first direction (x direction) may be W. For example, the width W of the gate structures 110 may be less than 80 nm. The width W of the gate structures 110 may correspond to a channel length of transistors in the first direction (x direction).

A plurality of gate structures 110 having the width W may be provided on the first region A. Top surfaces of the gate structures 110 provided on the first region A may be flat. A top surface of the interlayer insulating layer 120 provided between the gate structures 110 on the first region A may also be flat. The top surface of the interlayer insulating layer 120 may have the same height as the top surfaces of the neighboring gate structures 110 to configure a single flat surface.

The single flat surface is achieved on the first region A because the gate structures 110 and the interlayer insulating layer 120 provided therebetween have small design rules and small widths and thus the top surfaces of the gate structures 110 and the top surface of the interlayer insulating layer 120 are provided to be flat together in a CMP process of the gate structures 110. The spacers 130 may be provided between the gate structures 110 and the interlayer insulating layer 120, top surfaces of the spacers 130 may also have the same height as the top surfaces of the neighboring gate structures 110 and the neighboring interlayer insulating layer 120 to configure a single flat surface.

The protective insulating layer 156 may be provided on the second region B of the semiconductor substrate 101. The protective insulating layer 156 may include a first protective insulating layer 152 and a second protective insulating layer 154. The protective insulating layer 156 may correspond to the protective insulating layer 24 or 69 of FIG. 1I or 2H. The protective insulating layer 156 may protect the second region B of the semiconductor substrate 101 during a manufacturing process and thus no defect may be generated.

FIGS. 6A to 6D are cross-sectional views of semiconductor devices 100a, 100b, 100c, and 100d according to other embodiments of the inventive concepts.

Specifically, FIGS. 6A to 6D are modified from the cross-sectional view of the semiconductor device 100 of FIG. 5. For convenience of explanation, the descriptions already given above in relation to FIGS. 4 and 5 are briefly provided or omitted herein.

Figure 6A:
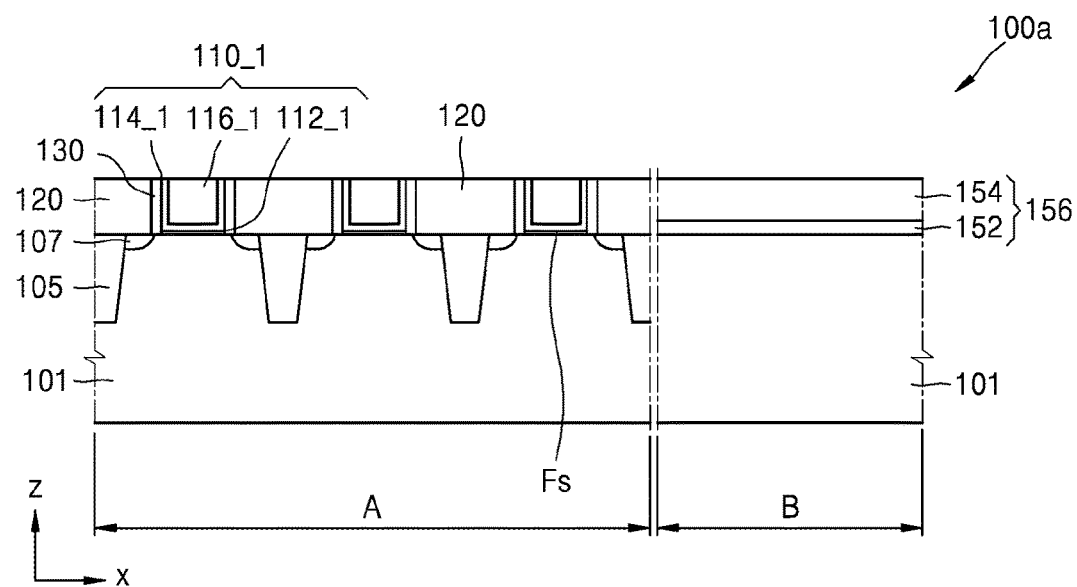
FIGS. 6A to 6D are cross-sectional views of semiconductor devices according to other example embodiments of the inventive concepts.

Referring to FIG. 6A, the semiconductor device 100a may differ from the semiconductor device 100 of FIG. 5 in the structure of gate structures 110_1. For example, the gate structures 110_1 may include a gate insulating layer 112_1, lower metal gate electrodes 114_1, and upper metal gate electrodes 116_1.

The gate insulating layer 112_1 may be provided only between the lower metal gate electrodes 114_1 and the semiconductor substrate 101, and may not be provided on side surfaces of the lower metal gate electrodes 114_1. A description of a material, a forming method, etc. of the gate insulating layer 112_1 is given above and thus is omitted herein.

The lower metal gate electrodes 114_1 may include at least one of, for example, titanium nitride (TiN), tantalum nitride (TaN), tantalum carbide (TaC), tantalum carbonitride (TaCN), titanium aluminide (TiAl), and titanium aluminum carbide (TiAlC). The lower metal gate electrodes 114_1 may serve as a work function adjustment layer and/or a barrier metal layer. As such, the lower metal gate electrodes 114_1 may include the barrier metal layer or may be provided separately from the barrier metal layer.

The upper metal gate electrodes 116_1 may correspond to the metal gate electrodes 114 of the semiconductor device 100 of FIG. 5. As such, a material, a forming method, etc. of the upper metal gate electrodes 116_1 are as described above in relation to the semiconductor device 100 of FIG. 4.

Figure 6B:
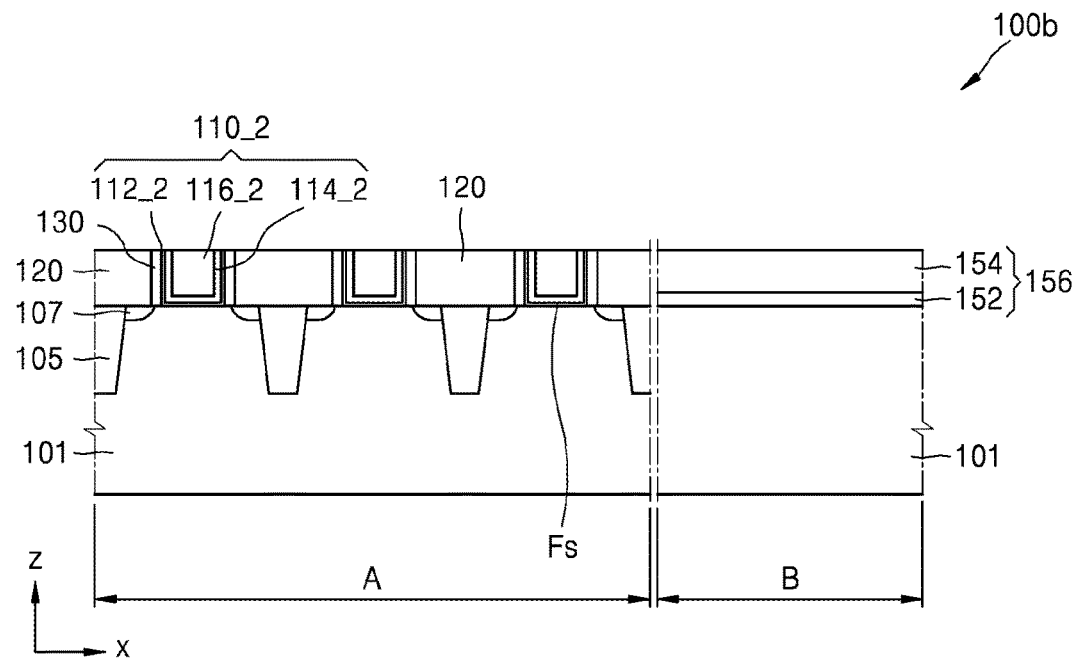

Referring to FIG. 6B, the semiconductor device 100b may differ from the semiconductor device 100 of FIG. 5 in structure of gate structures 110_2. The gate structures 110_2 may include a gate insulating layer 112_2, lower metal gate electrodes 114_2, and upper metal gate electrodes 116_2.

The gate insulating layer 112_2 may have a structure similar to the structure of the gate insulating layer 112 of the semiconductor device 100 of FIG. 5. That is, the gate insulating layer 112_2 may be provided on bottom and side surfaces of the lower metal gate electrodes 114_2. A material of the gate insulating layer 112_2 is as described above in relation to the semiconductor device 100 of FIG. 5.

Structures and materials of the lower metal gate electrodes 114_2 and the upper metal gate electrodes 116_2 are as described above in relation to the lower metal gate electrodes 114_1 and the upper metal gate electrodes 116_1 of the semiconductor device 100a of FIG. 6A.

Figure 6C:
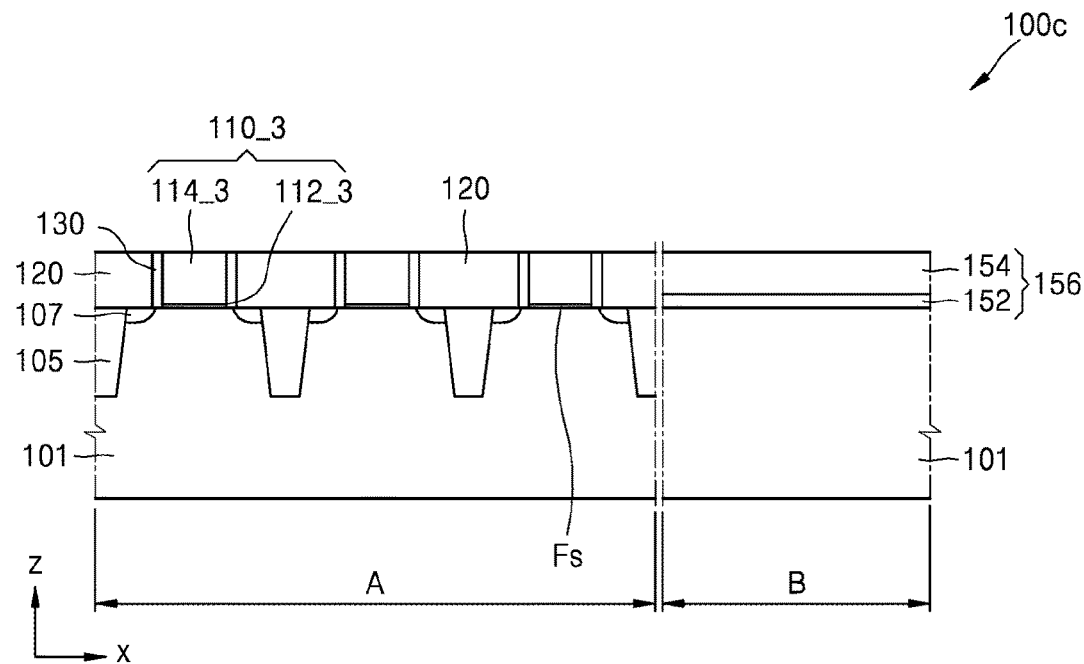

Referring to FIG. 6C, the semiconductor device 100c may differ from the semiconductor device 100 of FIG. 5 in structure of gate structures 110_3. The gate structures 110_3 may include a gate insulating layer 112_3 and metal gate electrodes 114_3. The gate insulating layer 112_3 may be provided only between the metal gate electrodes 114_3 and the semiconductor substrate 101 and may not be provided on side surfaces of the metal gate electrodes 114_3 as in the semiconductor device 100a of FIG. 6A.

The metal gate electrodes 114_3 may be provided on the gate insulating layer 112_3 and may include a barrier metal layer provided on outer edges thereof. A material, a forming method, etc. of the metal gate electrodes 114_3 are as described above in relation to the semiconductor device 100 of FIG. 5.

Figure 6D:
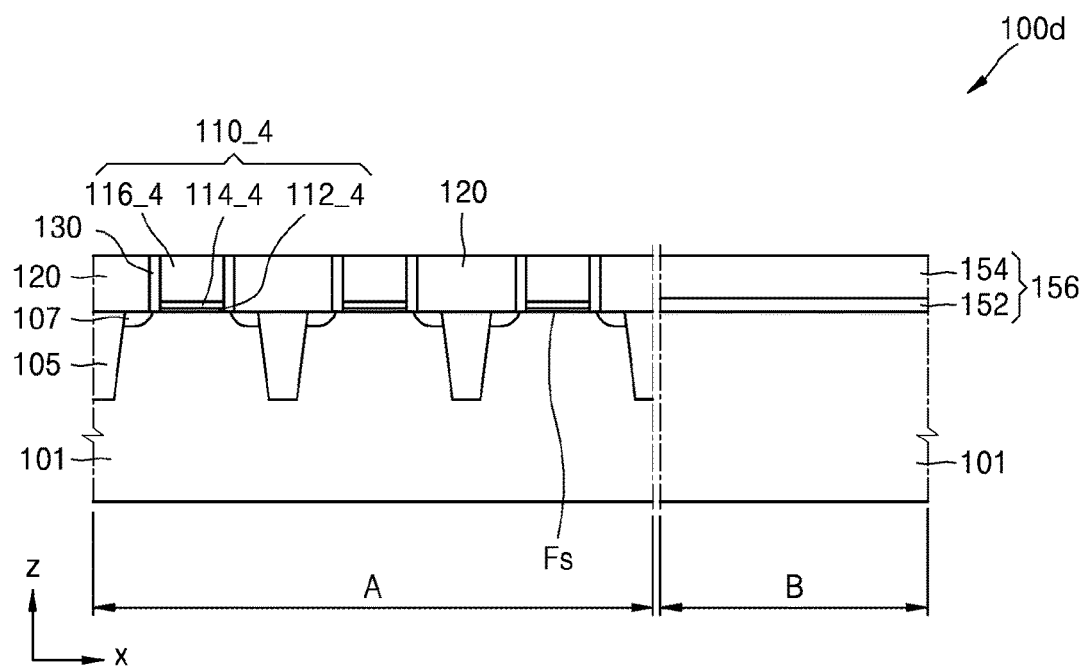

Referring to FIG. 6D, the semiconductor device 100d may differ from the semiconductor device 100 of FIG. 5 in the structure of gate structures 110_4. The gate structures 110_4 may include a gate insulating layer 112_4, lower metal gate electrodes 114_4, and upper metal gate electrodes 116_4.

The gate insulating layer 112_4 may be provided only between the lower metal gate electrodes 114_4 and the semiconductor substrate 101 as in the semiconductor device 100a of FIG. 6A. In addition, the lower metal gate electrodes 114_4 may be provided only between the upper metal gate electrodes 116_4 and the gate insulating layer 112_4. That is, differently from the semiconductor device 100a of FIG. 6A, the lower metal gate electrodes 114_4 may not be provided on side surfaces of the upper metal gate electrodes 116_4.

Materials, forming methods, etc. of the gate insulating layer 112_4, the lower metal gate electrodes 114_4, and the upper metal gate electrodes 116_4 are as described above in relation to the semiconductor device 100a of FIG. 6A.

Figure 8:
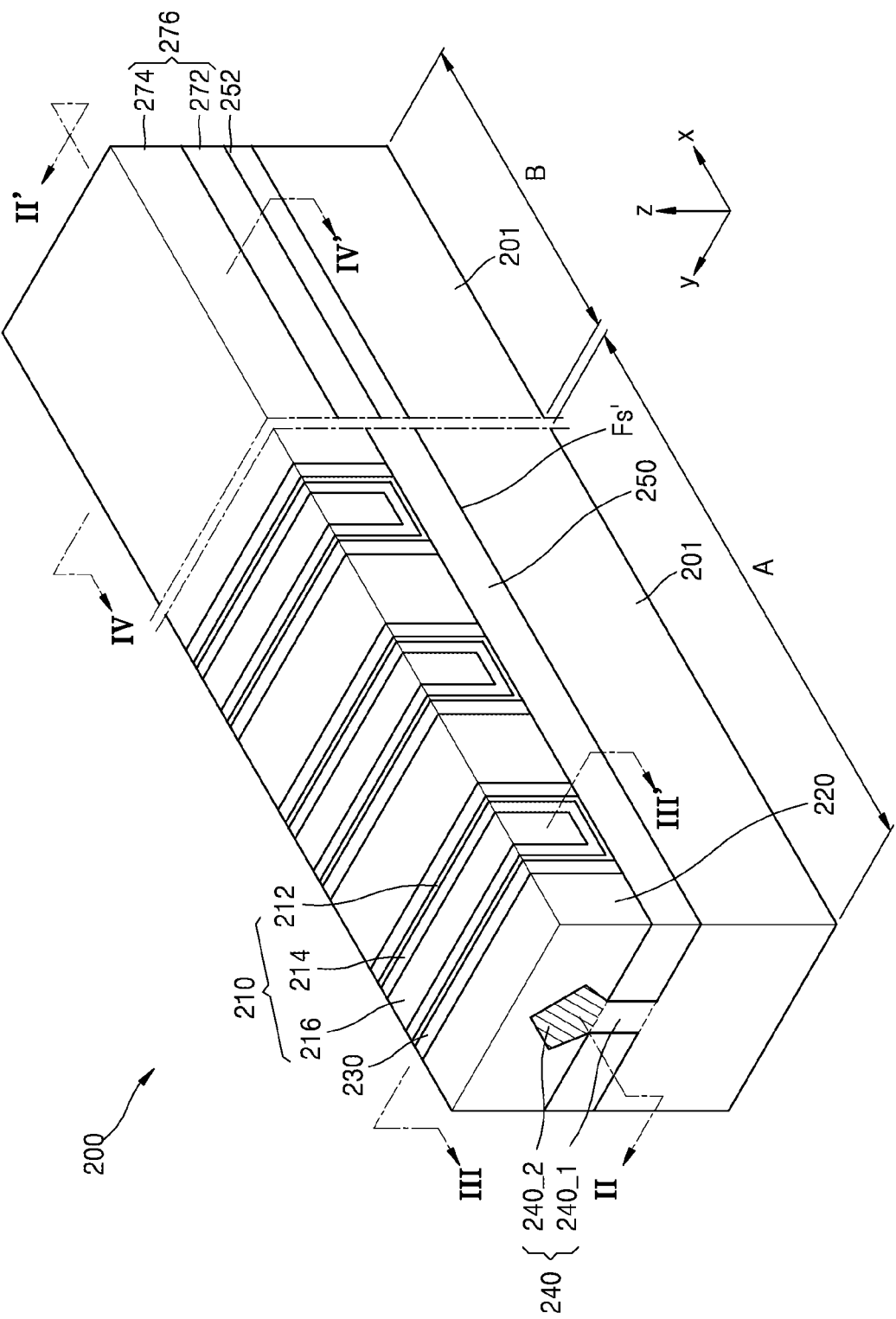
FIG. 8 is a perspective view of the semiconductor device of FIG. 7.
Figure 9:
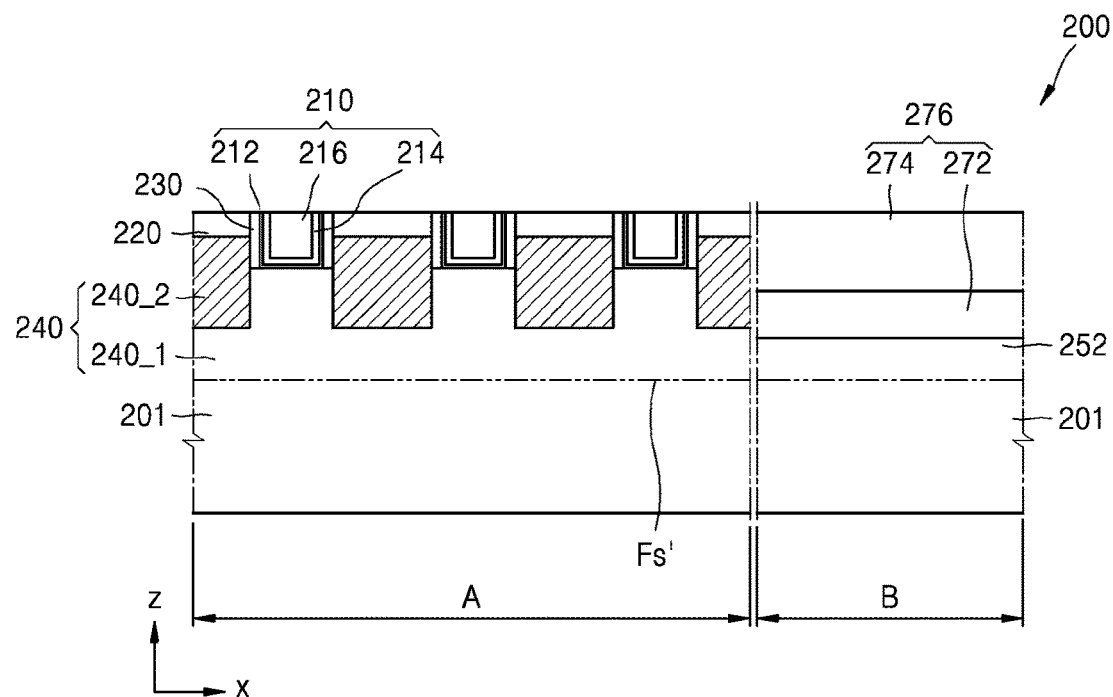
FIG. 9 is a cross-sectional view taken along line II-II' of the semiconductor device of FIG. 8.
Figure 10:
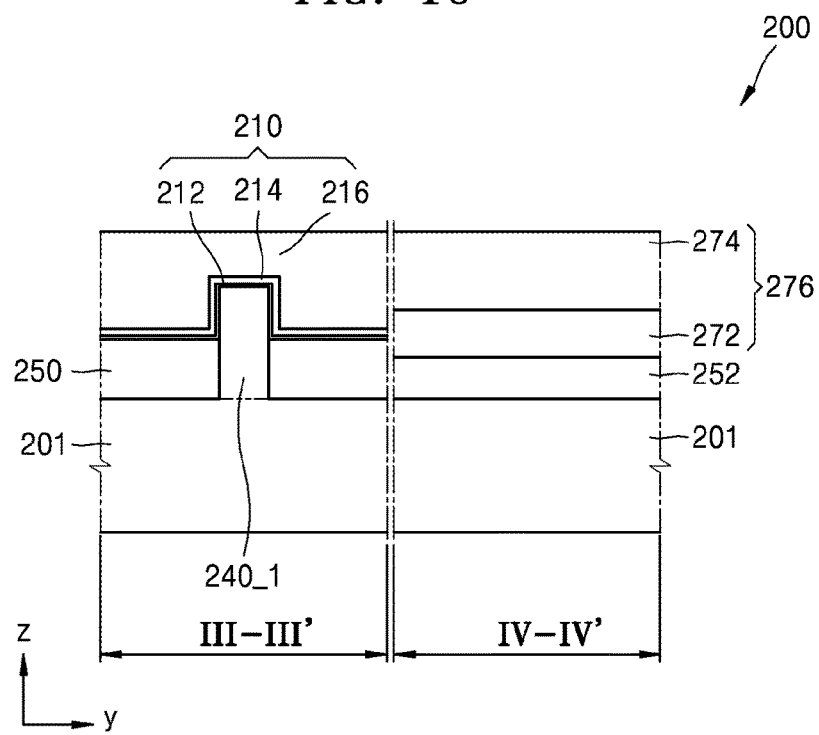
FIG. 10 is a cross-sectional view taken along line III-III' and line IV-IV' of the semiconductor device of FIG. 8.

FIG. 7 is a plan view of a semiconductor device 200 t of the inventive concepts, FIG. 8 is a perspective view of the semiconductor device 200 of FIG. 7, FIG. 9 is a cross-sectional view taken along line II-II' of the semiconductor device 200 of FIG. 8, and FIG. 10 is a cross-sectional view taken along line III-III' and line IV-IV' of the semiconductor device 200 of FIG. 8.

Specifically, in FIGS. 7 to 10, the descriptions already given above in relation to FIGS. 1A to 1I, and 2A to 2H are briefly provided or omitted herein. A semiconductor substrate 201 may include a first region A and a second region B. The first region A may be a patterning region or a chip region, and the second region B may be a non-patterning region or a substrate edge region.

The semiconductor device 200 may include fins 240 provided as active regions on the semiconductor substrate 201. The semiconductor device 200 may include the semiconductor substrate 201, the fins 240, an isolation layer 250, gate structures 210, an interlayer insulating layer 220, and a protective insulating layer 276.

The semiconductor substrate 201 may correspond to the semiconductor substrate 101 of the semiconductor device 100 of FIGS. 4 and 5, and thus a detailed description thereof is omitted herein. The fins 240 may protrude from the semiconductor substrate 201 and extend in a first direction (x direction). A plurality of fins 240 may be provided on the semiconductor substrate 201 along a second direction (y direction).

The fins 240 may include lower fins 240_1 and upper fins 240_2. The lower fins 240_1 may be parts provided based on the semiconductor substrate 201, and the upper fins 240_2 may be provided as an epitaxial layer grown from the lower fins 240_1. As illustrated in FIG. 9, the upper fins 240_2 may configure source/drain regions with respect to the gate structures 210 and the lower fins 240_1 may configure channel regions under the gate structures 210.

When the fins 240 include the upper fins 240_2 as an epitaxial layer as described above, the fins 240 may include silicon or germanium which is a semiconductor element. In addition, the fins 240 may include a compound semiconductor such as a group IV-IV compound semiconductor or a group III-V compound semiconductor. For example, as the group IV-IV compound semiconductor, the fins 240 may include a binary compound or a ternary compound including at least two of carbon (C), silicon (Si), germanium (Ge), and tin (Sn), or a compound thereof doped with a group IV element. For example, as the group III-V compound semiconductor, the fins 240 may include any one of a binary compound, a ternary compound, and a quaternary compound generated by combining at least one of aluminum (Al), gallium (Ga), and indium (In), which are group III elements, with one of phosphorus (P), arsenic (As), and antimony (Sb), which are group V elements.

In the semiconductor device 200, the upper fins 240_2 may have various shapes. For example, on a cross section perpendicular to the first direction (x direction), the upper fins 240_2 may have various shapes of diamonds, circles, ovals, and polygons. FIG. 8 illustrates a pentagonal diamond shape as an example.

The isolation layer 250 may be provided on the first region A of the semiconductor substrate 201. The isolation layer 250 may be provided to surround two side surfaces of each of the lower fins 240_1 of the fins 240. A base insulating layer 252 may be provided on the second region B of the semiconductor substrate 201. The base insulating layer 252 may be an insulating layer, e.g., a silicon oxide layer, generated to a certain thickness during a semiconductor device manufacturing process. The base insulating layer 252 may be provided to a certain thickness or may not be provided if not necessary.

The isolation layer 250 corresponds to the isolation layer 105 of the semiconductor device 100 of FIGS. 4 and 5, and may electrically separate the fins 240 provided along the second direction (y direction), from each other. The isolation layer 250 may include at least one of, for example, a silicon oxide layer, a silicon nitride layer, a silicon oxynitride layer, and a combination thereof.

The upper fins 240_2 of the fins 240 may not be surrounded by the isolation layer 250 and may protrude therefrom. As illustrated in FIG. 10, parts of the lower fins 240_1 of the fins 240 provided under the gate structures 210 may protrude from the isolation layer 250.

The gate structures 210 may extend across the fins 240 in the second direction (y direction) on the isolation layer 250, and may be provided along the first direction (x direction). The gate structures 210 may correspond to the gate structures 110 of the semiconductor device 100 of FIGS. 4 and 5. However, in the semiconductor device 200, similarly to the semiconductor device 100b of FIG. 6B, the gate structures 210 may include a gate insulating layer 212, lower metal gate electrodes 214, and upper metal gate electrodes 216.

The gate structures 210 may be provided to surround top surfaces and parts of side surfaces of the lower fins 240_1 of the fins 240. A material, a forming method, etc. of the gate structures 210 are as described above in relation to the semiconductor device 100 of FIGS. 4 and 5 and the semiconductor device 100b of FIG. 6B.

The interlayer insulating layer 220 may be provided on the isolation layer 250 to cover the fins 240. The interlayer insulating layer 220 may be provided on the isolation layer 250 between the gate structures 210 to cover the fins 240. Since the fins 240 serving as active regions protrude, the interlayer insulating layer 220 may surround top surfaces and parts of side surfaces of the fins 240. The interlayer insulating layer 220 may be provided to surround the upper fins 240_2 of the fins 240. The interlayer insulating layer 220 may correspond to the interlayer insulating layer 120 of the semiconductor device 100 of FIGS. 4 and 5. A material, a forming method, etc. of the interlayer insulating layer 220 are as described above in relation to the semiconductor device 100 of FIGS. 4 and 5.

Spacers 230 may be provided between the interlayer insulating layer 220 and the gate structures 210. The spacers 230 may extend in the second direction (y direction) to surround two side surfaces of each of the gate structures 210. Similarly to the gate structures 210, the interlayer insulating layer 220 may cross the fins 240 and surround the top surfaces and the side surfaces of the fins 240. The spacers 230 may correspond to the spacers 130 of the semiconductor device 100 of FIGS. 4 and 5. Accordingly, a material, etc. of the spacers 230 are as described above in relation to the semiconductor device 100 of FIGS. 4 and 5.

Top surfaces of the gate structures 210, the interlayer insulating layer 220, and the spacers 230 may be flat and may have the same height from a top surface Fs' of the semiconductor substrate 201. As such, the top surfaces of the gate structures 210, the interlayer insulating layer 220, and the spacers 230 may configure a single flat surface.

The protective insulating layer 276 may be provided on the second region B of the semiconductor substrate 201. The protective insulating layer 276 may include a first protective insulating layer 272 and a second protective insulating layer 274. The protective insulating layer 276 may correspond to the protective insulating layer 24 or 69 of FIG. 1I or 2H. The protective insulating layer 276 may protect the second region B of the semiconductor substrate 201 and thus no defect may be generated.

Figure 11:
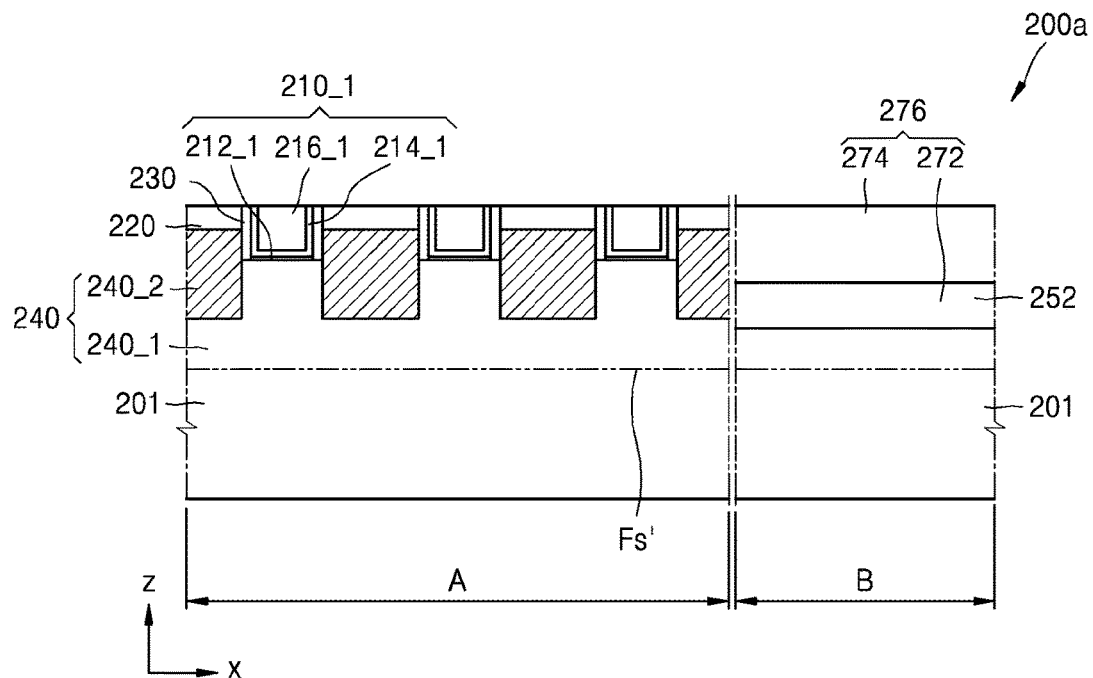
FIG. 11 is a cross-sectional view of a semiconductor device according to other example embodiments of the inventive concepts.

FIG. 11 is a cross-sectional view of a semiconductor device 200a according to other embodiments of the inventive concepts.

Specifically, FIG. 11 is modified from the cross-sectional view of the semiconductor device 200 of FIG. 9. For convenience of explanation, the descriptions already given above in relation to FIGS. 7 to 10 are briefly provided or omitted herein.

The semiconductor device 200a may differ from the semiconductor device 200 of FIGS. 7 to 10 in the structure of gate structures 210_1. For example, the gate structures 210_1 may include a gate insulating layer 212_1, lower metal gate electrodes 214_1, and upper metal gate electrodes 216_1.

Similarly to the semiconductor device 100a of FIG. 6A, the gate insulating layer 212_1 may be provided only between the lower metal gate electrodes 214_1 and the lower fins 240_1. That is, the gate insulating layer 212_1 may not be provided on side surfaces of the lower metal gate electrodes 214_1. As such, a material, a forming method, etc. of the gate insulating layer 212_1 are as described above in relation to the semiconductor device 100a of FIG. 6A.

Materials, forming methods, etc. of the lower metal gate electrodes 214_1 and the upper metal gate electrodes 216_1 are also as described above in relation to the semiconductor device 100a of FIG. 6A. However, since the gate structures 210_1 are provided to surround top surfaces and parts of side surfaces of the fins 240, the gate insulating layer 212_1, the lower metal gate electrodes 214_1, and the upper metal gate electrodes 216_1 may also be provided to surround the top surfaces and the parts of the side surfaces of the fins 240.

In the semiconductor device 200a, the protective insulating layer 276 may also be provided on the second region B of the semiconductor substrate 201. The protective insulating layer 276 may include the first protective insulating layer 272 and the second protective insulating layer 274. The protective insulating layer 276 may protect the second region B of the semiconductor substrate 201 and thus no defect may be generated.

Figure 12A:
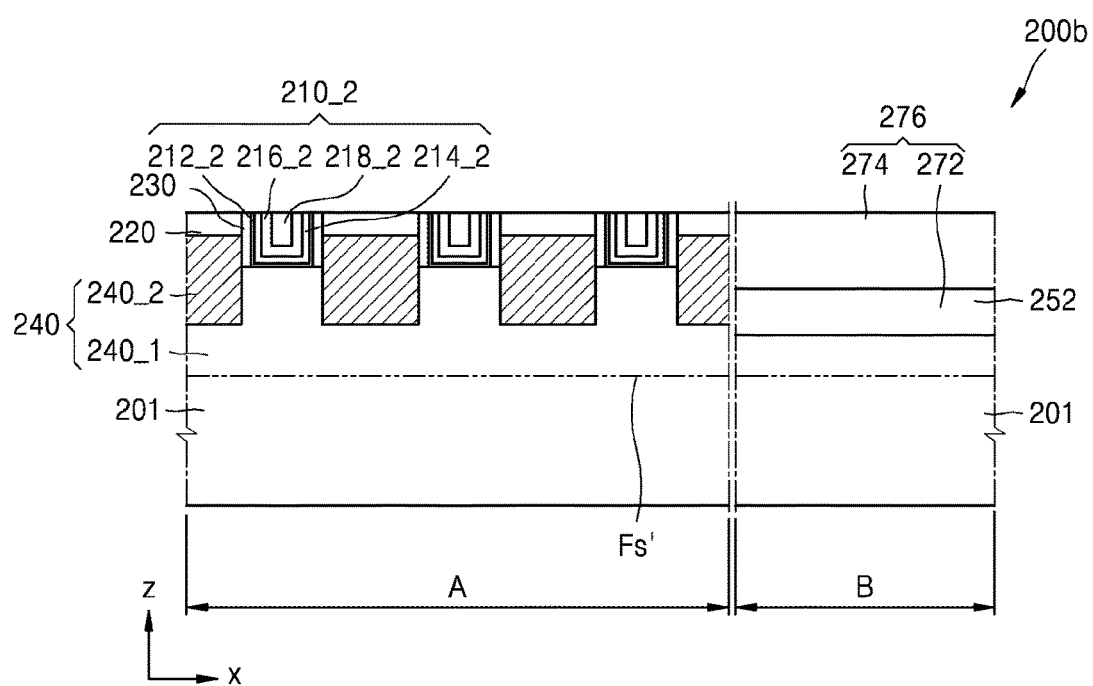
FIGS. 12A and 12B are cross-sectional views of a semiconductor device according to other example embodiments of the inventive concepts.
Figure 12B:
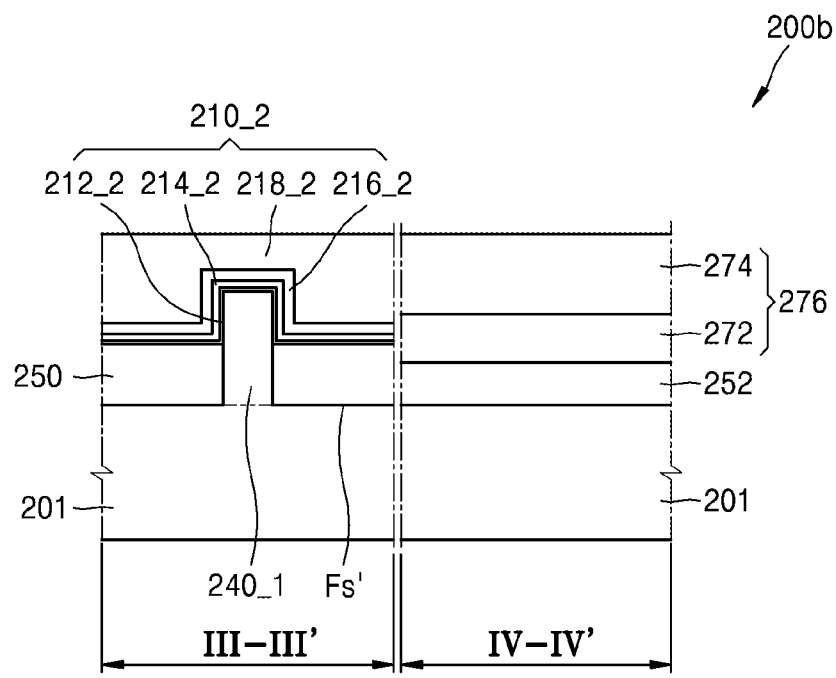

FIGS. 12A and 12B are cross-sectional views of a semiconductor device 200b according to other embodiments of the inventive concepts.

Specifically, FIG. 12A may be modified from the semiconductor device 200 of FIG. 9. FIG. 12B may be modified from the semiconductor device 200 of FIG. 10. For convenience of explanation, the descriptions already given above in relation to FIGS. 7 to 10 are briefly provided or omitted herein.

The semiconductor device 200b may differ from the semiconductor device 200 of FIGS. 7 to 10 or the semiconductor device 200a of FIG. 11 in the structure of gate structures 210_2. For example, the gate structures 210_2 may be provided on the first region A of the semiconductor device 200b. The gate structures 210_2 may include a gate insulating layer 212_2, lower metal gate electrodes 214_2, a barrier metal layer 216_2, and upper metal gate electrodes 218_2. The gate insulating layer 212_2 may be provided to surround bottom and side surfaces of the lower metal gate electrodes 214_2. A material and a forming method of the gate insulating layer 212_2 are as described above in relation to the semiconductor device 200 of FIGS. 7 to 10.

The lower metal gate electrodes 214_2 may be provided on the gate insulating layer 212_2 to surround bottom and side surfaces of the barrier metal layer 216_2. Since the gate structures 210_2 are provided to surround top surfaces and parts of side surfaces of the fins 240, the lower metal gate electrodes 214_2 may also be provided to surround the top surfaces and the parts of the side surfaces of the fins 240.

The barrier metal layer 216_2 may be provided on the lower metal gate electrodes 214_2 to surround bottom and side surfaces of the upper metal gate electrodes 218_2. Due to an overall structure of the gate structures 210_2, the barrier metal layer 216_2 may be provided to surround the top surfaces and the parts of the side surfaces of the fins 240. The upper metal gate electrodes 218_2 may be provided on the barrier metal layer 216_2. The upper metal gate electrodes 218_2 may be provided to surround the top surfaces and the parts of the fins 240. Top surfaces of the gate structures 210_2, the spacers 230, and the interlayer insulating layer 220 may have the same height and configure a single flat surface on the first region A.

In the semiconductor device 200b, the protective insulating layer 276 may also be provided on the second region B of the semiconductor substrate 201. The protective insulating layer 276 may include the first protective insulating layer 272 and the second protective insulating layer 274. The protective insulating layer 276 may protect the second region B of the semiconductor substrate 201 and thus no defect may be generated.

Figure 13:
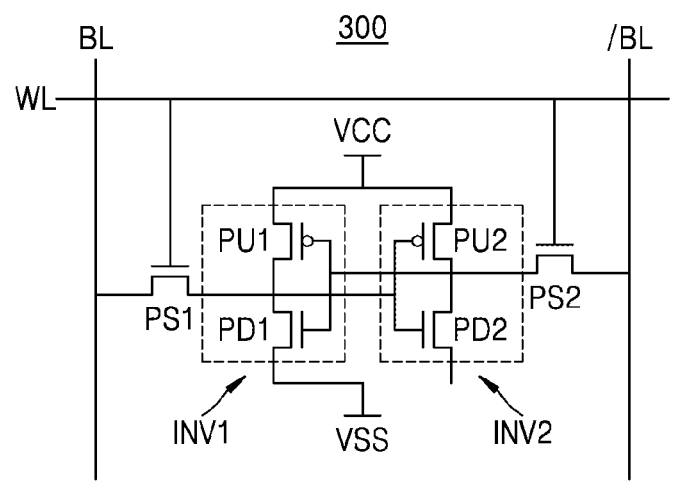
FIGS. 13 and 14 are a circuit diagram and a layout diagram for describing a semiconductor device according to other example embodiments of the inventive concepts.
Figure 14:
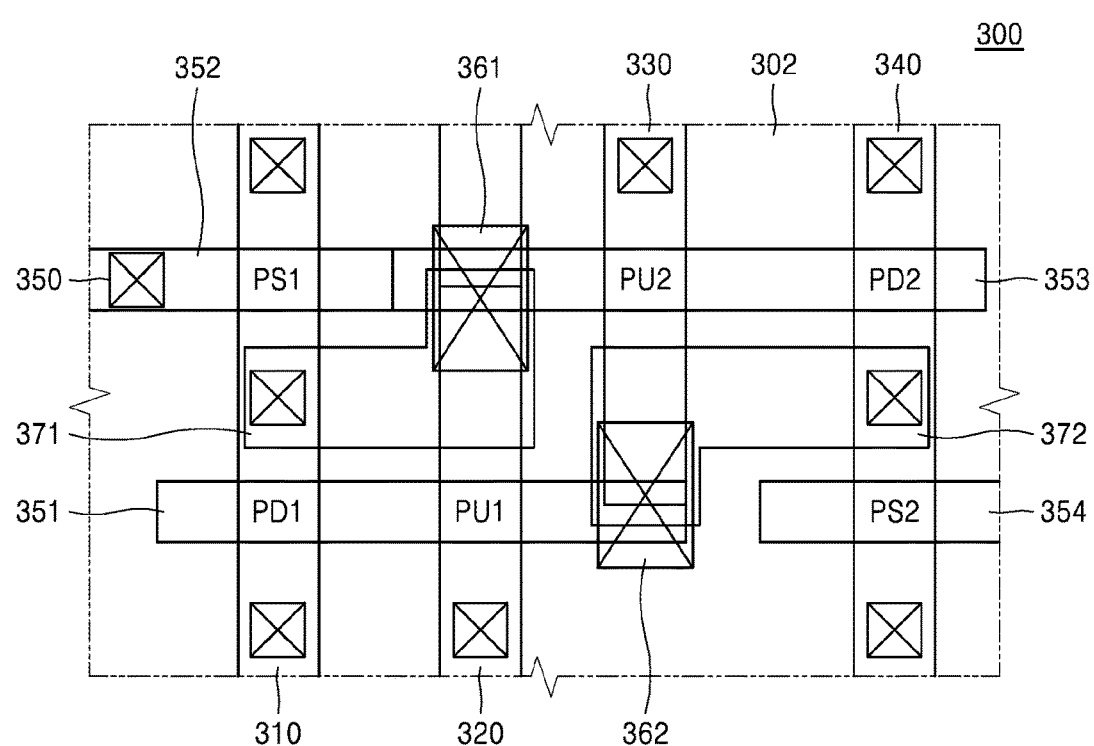

FIGS. 13 and 14 are a circuit diagram and a layout diagram for describing a semiconductor device 300 according to other embodiments of the inventive concepts.

Specifically, the semiconductor device 300 may include a pair of inverters, e.g., a first inverter INV1 and a second inverter INV2, connected in parallel between a power source node VCC and a ground node VSS, and a first pass transistor PS1 and a second pass transistor PS2 connected to output nodes of the first and second inverters INV1 and INV2, respectively. The first and second pass transistors PS1 and PS2 may be connected to a bit line BL and a complementary bit line BL/, respectively. Gates of the first and second pass transistors PS1 and PS2 may be connected to a word line WL.

The first inverter INV1 includes a first pull-up transistor PU1 and a first pull-down transistor PD1 connected in series to each other, and the second inverter INV2 includes a second pull-up transistor PU2 and a second pull-down transistor PD2 connected in series to each other. The first and second pull-up transistors PU1 and PU2 may be p-type metal-oxide-semiconductor (PMOS) transistors, and the first and second pull-down transistors PD1 and PD2 may be n-type metal-oxide-semiconductor (NMOS) transistors.

To configure a single latch circuit, an input node of the first inverter INV1 may be connected to the output node of the second inverter INV2, and an input node of the second inverter INV2 may be connected to the output node of the first inverter INV1.

A first active region 310, a second active region 320, a third active region 330, and a fourth active region 340, which are spaced apart from each other, may extend in a first direction (x direction). The second and third active regions 320 and 330 may extend to a length less than that of the first and fourth active regions 310 and 340.

A first gate electrode 351, a second gate electrode 352, a third gate electrode 353, and a fourth gate electrode 354 may extend in a second direction (y direction) to cross the first to fourth active regions 310, 320, 330, and 340. Specifically, the first gate electrode 351 may cross the first and second active regions 310 and 320, and partially overlap with an end of the third active region 330. The third gate electrode 353 may cross the third and fourth active regions 330 and 340, and partially overlap with an end of the second active region 320. The second and fourth gate electrodes 352 and 354 may cross the first and fourth active regions 310 and 340, respectively.

As illustrated in FIG. 14, the first pull-up transistor PU1 may be defined near a region where the first gate electrode 351 and the second active region 320 cross each other, the first pull-down transistor PD1 may be defined near a region where the first gate electrode 351 and the first active region 310 cross each other, and the first pass transistor PS1 may be defined near a region where the second gate electrode 352 and the first active region 310 cross each other. The second pull-up transistor PU2 may be defined near a region where the third gate electrode 353 and the third active region 330 cross each other, the second pull-down transistor PD2 may be defined near a region where the third gate electrode 353 and the fourth active region 340 cross each other, and the second pass transistor PS2 may be defined near a region where the fourth gate electrode 354 and the fourth active region 340 cross each other.

Although not shown in FIG. 14, sources and drains may be provided at two sides of the regions where the first to fourth gate electrodes 351 to 354 and the first to fourth active region 310, 320, 330, and 340 cross each other. A plurality of contacts 350 may be provided. A shared contact 361 may interconnect the second active region 320, the third gate electrode 353, and a wire 371. A shared contact 362 may interconnect the third active region 330, the first gate electrode 351, and a wire 372.

For example, the semiconductor device 300 may be a static random access memory (SRAM). Herein, the first to fourth gate electrodes 351 to 354 may correspond to gate structures provided on the first region A of any of the semiconductor devices 100, 100a, 100b, 100c, 100d, 200, 200a, and 200b of FIGS. 4 to 12. The first to fourth active regions 310, 320, 330, and 340 may correspond to active regions or fins provided on the first region A of any of the semiconductor devices 100, 100a, 100b, 100c, 100d, 200, 200a, and 200b of FIGS. 4 to 12.

Figure 15:
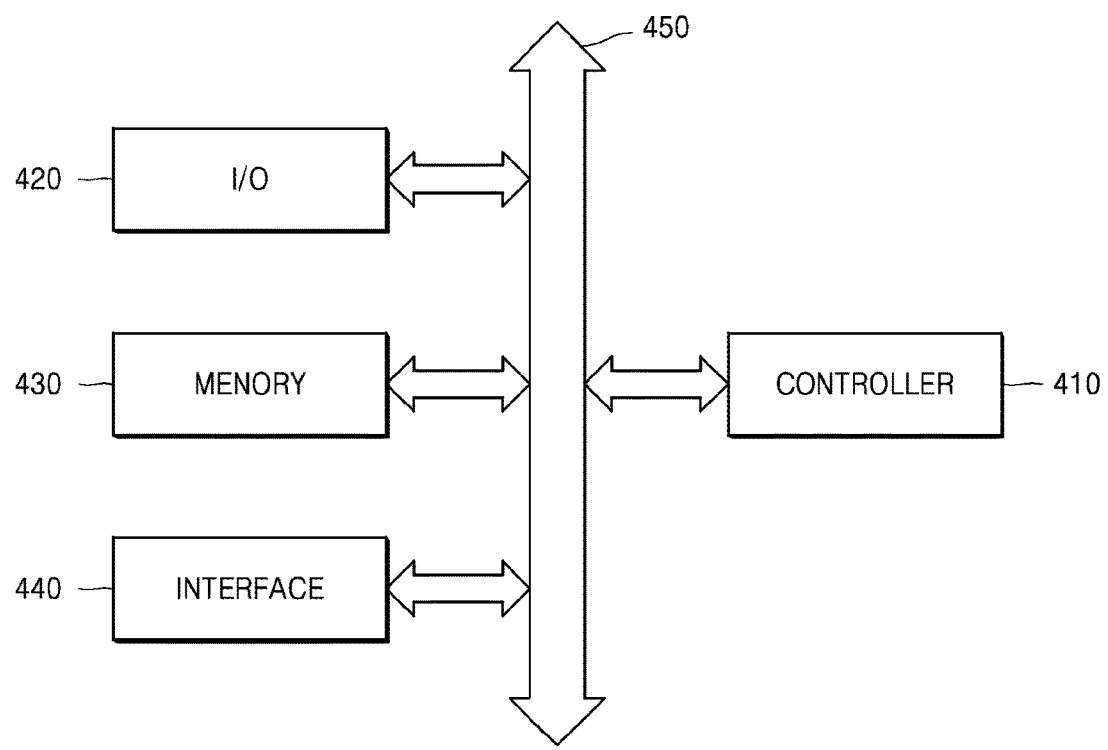
FIG. 15 is a block diagram of an electronic system including a semiconductor device, according to other example embodiments of the inventive concepts.

FIG. 15 is a block diagram of an electronic system 400 including a semiconductor device, according to embodiments of the inventive concepts.

Specifically, the electronic system 400 may include a controller 410, an input/output (I/O) unit 420, a memory 430, an interface 440, and a bus 450. The controller 410, the I/O unit 420, the memory 430, and/or the interface 440 may be connected to each other through the bus 450. The bus 450 may be a data path.

The controller 410 may include at least one selected among a microprocessor, a digital signal processor, a microcontroller, and logic elements capable of performing functions similar to those of the afore-mentioned elements. The I/O unit 420 may include a keypad, a keyboard, a display device, etc. The memory 430 may store data and/or commands. The interface 440 may transmit or receive data to or from a communication network. The interface 440 may be a wired or wireless interface. For example, the interface 440 may include an antenna, a wired/wireless transceiver, or the like.

Although not shown in FIG. 15, the electronic system 400 may further include a high-speed dynamic random access memory (DRAM) and/or SRAM, as an operation memory for operational improvement of the controller 410. At least one of the semiconductor devices 100, 100a, 100b, 100c, 100d, 200, 200a, and 200b according to embodiments of the inventive concepts may be provided in the memory 430 or provided as a part of the controller 410, the I/O unit 420, or the like.

The electronic system 400 may be applied to personal digital assistants (PDAs), portable computers, web tablets, wireless phones, mobile phones, digital music players, memory cards, and all electronic products capable of transmitting and/or receiving data in a wireless environment.

Figure 16:
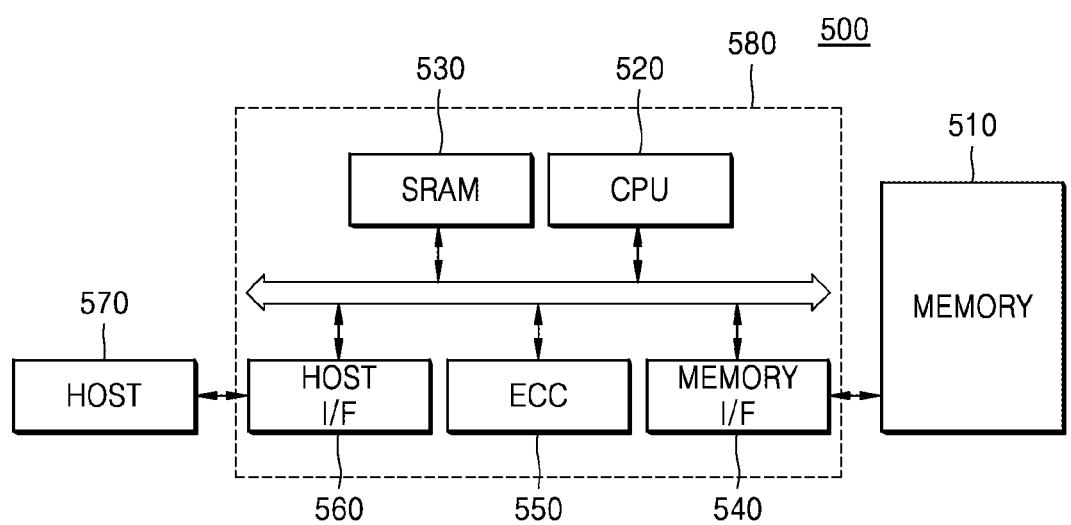
FIG. 16 is a block diagram of an electronic system including a semiconductor device, according to other example embodiments of the inventive concepts.

FIG. 16 is a block diagram of an electronic system 500 including a semiconductor device, according to other embodiments of the inventive concepts.

Specifically, the electronic system 500 may be a memory card. The electronic system 500 may include a memory 510 and a memory controller 580. The memory controller 580 may control data exchange between a host 570 and the memory 510. The memory 510 and the memory controller 580 may include at least one of the semiconductor devices 100, 100a, 100b, 100c, 100d, 200, 200a, and 200b according to other embodiments of the inventive concepts.

The memory controller 580 may include an SRAM 530, a central processing unit (CPU) 520, a host interface 560, an error correcting code (ECC) 550, and a memory interface 540. The SRAM 530 may be used as an operation memory of the CPU 520. The host interface 560 may include a protocol required when the host 570 accesses and exchanges data with the electronic system 500. The ECC 550 may detect and correct errors of data read from the memory 510. The memory interface 540 may provide an interface for data input and output to and from the memory 510. The CPU 520 may provide overall control related to data exchange of the memory controller 580.

Based on a method of manufacturing a semiconductor device, according to the inventive concepts, dummy gate structures including a dummy gate insulating layer and dummy gate electrodes are provided on a first region of a semiconductor substrate. Spacers are provided on two side walls of each of the dummy gate structures, and an interlayer insulating layer is provided between the spacers.

A protective insulating layer and a liner layer are provided on a second region of the semiconductor substrate. As such, in a manufacturing process for removing the dummy gate electrodes of the first region of the semiconductor substrate, the liner layer and the protective insulating layer may protect the second region of the semiconductor substrate and thus no defect may be generated.

While the inventive concepts have been particularly shown and described with reference to embodiments thereof, it will be understood that various changes in form and details may be made therein without departing from the spirit and scope of the following claims.

What is claimed is:

1. A method of manufacturing a semiconductor device, the method comprising:
forming dummy gate structures including a dummy gate insulating layer and dummy gate electrodes, on a first region of a semiconductor substrate, the first region including a patterning region;
forming spacers on two side walls of each of the dummy gate structures;
forming an interlayer insulating layer on the semiconductor substrate and the dummy gate structures;
forming a protective insulating layer on a second region of the semiconductor substrate, the second region being a non-patterning region;
forming a liner layer on the protective insulating layer;
planarizing the interlayer insulating layer;
forming openings by removing the dummy gate structures; and
forming gate structures including a gate insulating layer and metal gate electrodes, in the openings,
wherein the interlayer insulating layer includes,
a first interlayer insulating layer,
a second interlayer insulating layer provided on the first interlayer insulating layer and formed of the same material as the spacers, and a third interlayer insulating layer provided on the second interlayer insulating layer, and
wherein the protective insulating layer includes,
a first protective insulating layer provided on the semiconductor substrate, and
a second protective insulating layer provided on the first protective insulating layer,
wherein the second interlayer insulating layer and the first protective insulating layer are simultaneously provided using substantially a same first material,
the third interlayer insulating layer and the second protective insulating layer are simultaneously provided using substantially a same second material.

2. The method of claim 1, wherein a plurality of active regions extending in a first direction and including a plurality of source/drain regions are provided on the first region of the semiconductor substrate, and
wherein the gate structures extend across the active regions in a second direction perpendicular to the first direction.

3. The method of claim 1, wherein a plurality of fins extending in a first direction and including a plurality of source/drain regions are provided on the first region of the semiconductor substrate, and
wherein the gate structures extend across the fins in a second direction perpendicular to the first direction.

4. The method of claim 1, further comprising processing the first interlayer insulating layer to be recessed to a level lower than a level of top surfaces of the dummy gate structures, before the interlayer insulating layer is planarized,
wherein the second interlayer insulating layer remains on the first interlayer insulating layer after the interlayer insulating layer is planarized.

5. The method of claim 1, wherein the first interlayer insulating layer, the third interlayer insulating layer, and the second protective insulating layer are provided as silicon oxide layers,
wherein the second interlayer insulating layer and the first protective insulating layer are provided as silicon nitride layers or silicon oxynitride layers, and
wherein the dummy gate structures includes a polysilicon layer.

6. The method of claim 1, wherein the forming of the liner layer on the protective insulating layer includes:
forming the liner layer on the interlayer insulating layer and the protective insulating layer;
forming a mask layer on the liner layer of the second region of the semiconductor substrate; and
removing the liner layer of the first region of the semiconductor substrate by using the mask layer as an etching mask.

7. The method of claim 1, wherein the liner layer is formed of a material having a slower etching or polishing speed, or rate, compared to the interlayer insulating layer.

8. The method of claim 1, wherein the planarizing the interlayer insulating layer includes
chemical mechanical polishing the interlayer the insulating layer; and
wherein the liner layer has a slower polish speed than the interlayer insulating layer.

9. The method of claim 1, wherein the planarizing the interlayer insulating layer includes
using the liner layer as an etching mask to expose top surfaces of the dummy gate structures
and wherein the liner layer has a slower etching speed than the interlayer insulating layer.

10. A method of manufacturing a semiconductor device, the method comprising:
forming dummy gate structures including a dummy gate insulating layer and dummy gate electrodes, on a first region of a semiconductor substrate, the first region including a chip region;
forming spacers on two side walls of each of the dummy gate structures;
forming an interlayer insulating layer on the semiconductor substrate and the dummy gate structures;
forming a protective insulating layer on a second region of the semiconductor substrate, the second region being a substrate edge region;
forming a liner layer on the protective insulating layer;
planarizing the interlayer insulating layer;
forming openings by removing the dummy gate structures; and
forming gate structures including a gate insulating layer and metal gate electrodes, in the openings, wherein, before the protective insulating layer is formed, a total thickness of the substrate edge region is less than a total thickness of the chip region.

11. The method of claim 10, wherein the interlayer insulating layer includes substantially the same material as the spacers, and
wherein the interlayer insulating layer is planarized to have the same level as top surfaces of the dummy gate structures.

12. The method of claim 10, wherein the liner layer is formed of a material having a slower etching or polishing speed compared to the interlayer insulating layer, and is provided as a polysilicon layer or a silicon oxycarbonitride (SiOCN) layer.

13. The method of claim 10, wherein the forming of the gate structures includes:
forming an insulating layer and a metal layer in the openings; and
forming the gate insulating layer and the metal gate electrodes by planarizing the insulating layer and the metal layer to expose a top surface of the interlayer insulating layer.

* * * * *